United States Patent
Teplinsky et al.

(10) Patent No.: US 11,143,689 B2
(45) Date of Patent: Oct. 12, 2021

(54) METHOD AND SYSTEM FOR DATA COLLECTION AND ANALYSIS FOR SEMICONDUCTOR MANUFACTURING

(71) Applicant: OPTIMAL PLUS LTD., Holon (IL)

(72) Inventors: Shaul Teplinsky, San Francisco, CA (US); Michael Schuldenfrei, Petach Tikwa (IL); Dan Sebban, Rishon LeZion (IL)

(73) Assignee: OPTIMAL PLUS LTD., Holon (IL)

( * ) Notice: Subject to any disclaimer, the term of this patent is extended or adjusted under 35 U.S.C. 154(b) by 600 days.

(21) Appl. No.: 16/000,707

(22) Filed: Jun. 5, 2018

(65) Prior Publication Data

US 2018/0348291 A1    Dec. 6, 2018

Related U.S. Application Data

(60) Provisional application No. 62/515,168, filed on Jun. 5, 2017.

(51) Int. Cl.
*G11C 7/00* (2006.01)
*G01R 31/26* (2020.01)
(Continued)

(52) U.S. Cl.
CPC ..... *G01R 31/2601* (2013.01); *G01R 31/2837* (2013.01); *G01R 31/2894* (2013.01);
(Continued)

(58) Field of Classification Search
CPC ......... H01L 22/20; H01L 22/00; H01L 25/00; H01L 25/0652; H01L 22/14;
(Continued)

(56) References Cited

U.S. PATENT DOCUMENTS 6,141,647 A * 10/2000 Meijer ................ G06Q 10/087
705/28
6,345,259 B1 * 2/2002 Sandoval .............. G06Q 10/06
705/7.11
(Continued)

OTHER PUBLICATIONS

International Search Report and Written Opinion received in International Patent Application No. PCT/US18/36138, dated Sep. 11, 2018. 17 pages.

(Continued)

*Primary Examiner* — Viet Q Nguyen
(74) *Attorney, Agent, or Firm* — Kilpatrick Townsend & Stockton LLP

(57) ABSTRACT

A method includes receiving system test data for a plurality of electronic systems. Each of the electronic systems includes a plurality of electronic components. The method also includes determining a relationship between a set of electronic components and the electronic systems upon which the electronic components of the set of electronic components are assembled and receiving manufacturing attributes including spatial data for the set of electronic components. The method further includes selecting a data subset from the system test data corresponding to a subgroup of the set of electronic components. The subgroup includes components within an area defined on a substrate according to a spatial pattern and that is fewer than all of the set of electronic components on the substrate. Additionally, the
(Continued)

method includes identifying an outlier relative to the data subset and communicating information about the outlier to at least one of a system or a component manufacturer.

16 Claims, 22 Drawing Sheets

(51) Int. Cl.
| | | |
|---|---|---|
| H01L 21/66 | (2006.01) | |
| G01R 31/28 | (2006.01) | |
| G06Q 50/04 | (2012.01) | |
| G06Q 10/06 | (2012.01) | |
| H01L 25/00 | (2006.01) | |
| H01L 25/065 | (2006.01) | |
| G06F 11/00 | (2006.01) | |
| G06F 9/30 | (2018.01) | |
| G06F 7/02 | (2006.01) | |
| G06F 17/11 | (2006.01) | |

(52) U.S. Cl.
CPC ........ *G06F 9/30003* (2013.01); *G06F 11/006* (2013.01); *G06Q 10/06395* (2013.01); *G06Q 50/04* (2013.01); *H01L 22/00* (2013.01); *H01L 22/20* (2013.01); *H01L 25/00* (2013.01); *H01L 25/0652* (2013.01); *G06F 7/02* (2013.01); *G06F 17/11* (2013.01); *H01L 22/14* (2013.01)

(58) Field of Classification Search
CPC ............ G01R 31/2837; G01R 31/2894; G06F 9/30003; G06F 11/006; G06F 7/02; G06F 7/11
USPC ................................ 707/97; 700/97; 365/201
See application file for complete search history.

(56) References Cited

U.S. PATENT DOCUMENTS

| | | | |
|---|---|---|---|
| 6,615,096 | B1 | 9/2003 | Durrant et al. |
| 6,810,429 | B1* | 10/2004 | Walsh ................... G06F 16/258 709/246 |
| 7,010,378 | B2* | 3/2006 | Ohishi ................. H05K 13/084 700/115 |
| 7,035,877 | B2* | 4/2006 | Markham .............. G06Q 50/00 |
| 7,580,766 | B1* | 8/2009 | Sharma .................. G06Q 10/06 700/100 |
| 8,165,845 | B1 | 4/2012 | Seebeck et al. |
| 8,799,113 | B2* | 8/2014 | Markham .............. B23Q 35/12 705/29 |
| 8,838,408 | B2* | 9/2014 | Linde .................. G01R 31/2891 702/150 |
| 9,519,732 | B1 | 12/2016 | Gennari et al. |
| 9,767,459 | B1 | 9/2017 | Teplinsky et al. |
| 10,430,719 | B2* | 10/2019 | David ..................... H01L 22/14 |
| 2005/0171702 | A1 | 8/2005 | Calabrese et al. |
| 2006/0085155 | A1 | 4/2006 | Miguelanez et al. |
| 2008/0022167 | A1 | 1/2008 | Chung et al. |
| 2011/0178967 | A1 | 7/2011 | Delp |
| 2016/0372303 | A1* | 12/2016 | Park ...................... G06K 9/6267 |
| 2017/0109646 | A1 | 4/2017 | David |
| 2018/0348290 | A1* | 12/2018 | Teplinsky ............... H01L 22/00 |

OTHER PUBLICATIONS

U.S. Appl. No. 16/000,684, Final Office Action dated Apr. 28, 2021, 11 pages.

U.S. Appl. No. 16/000,684, Non-Final Office Action dated Dec. 9, 2020, 10 pages.

\* cited by examiner

METHOD AND SYSTEM FOR DATA COLLECTION AND ANALYSIS FOR SEMICONDUCTOR MANUFACTURING

CROSS-REFERENCES TO RELATED APPLICATIONS

This application claims priority to U.S. Provisional Patent Application No. 62/515,168, filed on Jun. 5, 2017, the disclosure of which is hereby incorporated by reference in its entirety for all purposes.

The following U.S. Non-Provisional patent applications (including this one) are being filed concurrently, and the entire disclosure of the other application is incorporated by reference into this application for all purposes:

U.S. patent application Ser. No. 16/000,684, filed on Jun. 5, 2018, entitled "METHOD AND SYSTEM FOR DATA COLLECTION AND ANALYSIS FOR SEMICONDUCTOR MANUFACTURING;" and U.S. patent application Ser. No. 16/000,707, filed on Jun. 5, 2018, entitled "METHOD AND SYSTEM FOR DATA COLLECTION AND ANALYSIS FOR SEMICONDUCTOR MANUFACTURING."

BACKGROUND OF THE INVENTION

Products manufactured and sold around the world today are often composed of many individual components that, when assembled together, form a structure or device that can perform various functions. Many modern products include electronic devices, such as smart phones, smart watches, computers, tablets, notebooks, automobiles, airplanes, and other similar products. Furthermore, it is not uncommon for the individual devices that make up the product to be products themselves, each having tens or even hundreds of their own assembled individual components. These individual components play a significant role in the quality and useful life of the product.

Despite the progress made in the field of product manufacturing technology, there is a need in the art for improved methods and systems related to product manufacturing.

SUMMARY OF THE INVENTION

Embodiments of the present invention relate to semiconductor manufacturing and the collection and analysis of data related to semiconductor devices and semiconductor manufacturing and assembly processes. More particularly, embodiments of the present invention provide a centralized data structure that is interconnected with both sources and users of semiconductor device manufacturing data and semiconductor system assembly data.

Other embodiments of the present invention relate to electronics manufacturing and the collection and analysis of data related to electronic devices and electronics manufacturing and assembly processes. More particularly, embodiments of the present invention provide a centralized data structure that is interconnected with both sources and users of electronic device manufacturing data and electronic system assembly data.

According to embodiments of the present invention, methods and systems are provided that enable sharing of data, analytics, and the like, and execution of actions across two or more stages of the electronic supply chain, including, without limitation, integrated circuit (IC) or component manufacturing and/or testing, module assembly and/or testing, system assembly and/or testing, and product assembly and/or testing.

The systems and method described herein can be implemented in a variety of manners, including, without limitation, forward sharing, e.g., from a semiconductor manufacturer to electronics manufacturer or from an electronics manufacturer to another electronics manufacturer. Additionally, backward sharing, e.g., from an electronics manufacturer to a semiconductor manufacturer. Moreover, mutual sharing, either forward or backward, or combinations thereof, are included within the scope of the present invention. As described herein, embodiments of the present invention provide a central data structure that can operate as a third party hub, thereby enabling transfer and analysis of data via a secure third party that can provide for data scrubbing and anonymization in order to protect proprietary data originating either at the semiconductor manufacturer or the electronics manufacturer.

According to an embodiment of the present invention, a method is provided that includes receiving system test data of electronic systems containing a plurality of electronic components from a system manufacturer and establishing a relationship between a set of electronic components from the plurality of electronic components and the electronic systems upon which the electronic components of the set of electronic components are assembled. The method also includes obtaining manufacturing attributes for the related set of electronic components from a component manufacturer and selecting a data subset from the system test data corresponding to a subgroup of the set of electronic components. The subgroup comprises components from the same fabrication cluster. The method further includes identifying an outlier in the data subset. The outlier comprises an outlier relative to the data subset. Additionally, the method includes communicating the information about the outlier to at least one of the system manufacturer or the component manufacturer. The system test data can indicate that the system passes system specifications, thereby indicating that the set of electronic systems is operable within predefined system specifications.

According to an embodiment of the present invention, a method is provided. The method includes receiving, from a system manufacturer, system test data for a plurality of electronic systems, each of the plurality of electronic systems comprising a plurality of electronic components. The set or plurality of electronic components can include a type of electronic component, for example, a power supply. The method also includes determining a relationship between a set of electronic components from the plurality of electronic components and the electronic systems upon which the electronic components of the set of electronic components are assembled. The method further includes receiving, from a component manufacturer, manufacturing attributes including spatial data for the set of electronic components and selecting a data subset from the system test data corresponding to a subgroup of the set of electronic components. The data subset can correspond to characteristics of the type of electronic component, for example, power output of the electronic system for the power supply component. The spatial data can include substrate location information for each of the set of electronic components. The subgroup comprises electronic components within an area defined on a substrate according to a spatial pattern and that is fewer than all of the set of electronic components on the substrate. The manufacturing attributes can include at least one of lot or batch number, substrate identifier, or substrate x-y coordinates for each of the set of electronic components. Thus, a fabrication cluster can be defined to include one or more lots. In other embodiments, a method of defining fabrication clusters is provided in which a fabrication cluster includes a first electronic component of the plurality of electronic components spatially positioned at a first position on a first substrate, for example, the periphery, and a second electronic component of the plurality of electronic components spatially positioned at the first position, i.e., the periphery, on a second substrate.

The method further includes identifying an outlier in the data subset, wherein the outlier comprises an outlier relative to the data subset, and communicating the information about the outlier to at least one of the system manufacturer or the component manufacturer. Identifying the outlier in the data set can be performed automatically or dynamically and can include receiving data for failing systems, but only analyzing system test data for non-failing systems, that is, electronic systems for which the system test data passes system specifications such that the electronic system is operable within the specifications for the particular electronic system. Additionally, identifying the outlier can include determining that a data subset includes a sufficient amount of data to perform a desired analysis.

The outlier can include a local outlier or a global outlier. The electronic components within an area can include adjacent electronic components that are spatially adjacent each other on the substrate. In an embodiment, the spatial pattern can be determined through clustering of spatial data. In another embodiment, the spatial pattern can be determined through clustering of manufacturing attributes. As an example, the system is not a failed system. That is, the system test data passes system specifications such that the electronic system is operable within the specifications for the particular electronic system. Thus, the data subset can be associated with systems having system test data passing system specifications. The system test data corresponding to the subgroup of the set of electronic components can include system test data for a system including a component, or specific test data from the system test data that may be attributed to or affected by one or more specific component, including system frequency or CPU frequency. The system test data can indicate that the system passes system specifications, thereby indicating that the set of electronic systems is operable within predefined system specifications.

According to another embodiment of the present invention, a method is provided. The method includes receiving, from a system manufacturer, system test data for a plurality of electronic systems. Each of the plurality of electronic systems includes a plurality of electronic components. The method also includes determining a relationship between a set of electronic components from the plurality of electronic components and the electronic systems upon which the electronic components of the set of electronic components are assembled and receiving, from a component manufacturer, manufacturing attributes including spatial data for the set of electronic components.

The method further includes selecting a first data subset from the system test data corresponding to a first subgroup of the set of electronic components. The first subgroup comprises components within a first area defined on a substrate according to a spatial pattern and that is fewer than all of the set of electronic components on the substrate. The method also includes selecting a second data subset from the system test data corresponding to a second subgroup of the set of electronic components. The second subgroup comprises components within a second area defined on the substrate that differs from the first area. The second area can exclude the first area. As examples, the first area can be associated with a central portion of the substrate and the second area can be associated with a periphery (e.g., a peripheral portion or region) of the substrate. In another example, the second area can be associated with a central portion of the substrate and the first area is associated with a periphery of the substrate. Thus, two distributions, i.e., the first data subset and the second data subset can be compared to each other in an embodiment to characterize differences between the distributions.

Additionally, the method includes identifying the first data subset as an outlier relative to the second data subset and communicating the information about the outlier to at least one of the system manufacturer or the component manufacturer. The outlier can include a global outlier. The first data subset and the second data subset can include a same set of system tests. As an example, the same set of system tests can include a single system test or a plurality of system tests. Moreover, the first data subset and the second data subset can include different system tests. In an embodiment, the first data subset comprises a first system test and the second data subset comprises a second system test. Alternatively, in another embodiment, the first data subset comprises a first system test and a third system test and the second data subset comprises the first system test and a fourth system test.

In an embodiment, the first area is associated with a central portion of the substrate and the second area is associated with a periphery of the substrate. In another embodiment, the second area is associated with a periphery of the substrate and the first area is associated with a central portion of the substrate. The system test data can indicate that the system passes system specifications, thereby indicating that the set of electronic systems is operable within predefined system specifications.

According to yet another embodiment of the present invention, a method is provided. The method includes receiving, from a system manufacturer, system test data for a plurality of electronic systems. Each of the plurality of electronic systems comprises a plurality of electronic components. The method also includes determining a relationship between a set of electronic components from the plurality of electronic components and the electronic systems upon which the electronic components of the set of electronic components are assembled and receiving, from a component manufacturer, manufacturing attributes including spatial data for the set of electronic components. The method further includes selecting a first data subset from the system test data corresponding to a first component from the set of electronic components and selecting a second data subset from the system test data corresponding to a second component from the set of electronic components. The first component is associated with a location on a first substrate and the second component is associated with the location on a second substrate. Additionally, the method includes identifying a common characteristic in the first data subset and second data subset and communicating the information about the common characteristic to at least one of the system manufacturer or the component manufacturer.

In an example, identifying a common characteristic in the first data subset and second data subset can be performed automatically. As an example, the common characteristic can indicate performance higher than a baseline. The baseline can be based on a third data subset corresponding to one or more components from the set of electronic components. The one or more components are associated with locations other than the location on the first and second substrates. In another example, the common characteristic can indicate performance lower than a standard. In an embodiment, the first electronic component and the second electronic component occupy the same location on two different substrates. The system test data can indicate that the system passes system specifications, thereby indicating that the set of electronic systems is operable within predefined system specifications.

According to an embodiment of the present invention, a method is provided. The method includes receiving, from a system manufacturer, system test data for a plurality of electronic systems. Each of the plurality of electronic systems comprises a plurality of electronic components. The method also includes determining a relationship between a set of electronic components from the plurality of electronic components and the electronic systems upon which the electronic components of the set of electronic components are assembled and receiving, from a component manufacturer, component test data for the set of electronic components. The method further includes generating a data subset comprising relationships between component test data for the set of electronic components and system test data the electronics systems upon which the set of electronic components is assembled and identifying an outlier in the data subset. The outlier comprises an outlier relative to the data subset. Additionally, the method includes communicating the information about the outlier to at least one of the system manufacturer or the component manufacturer. The system test data can indicate that the system passes system specifications, thereby indicating that the set of electronic systems is operable within predefined system specifications.

According to yet another embodiment of the present invention, a method is provided. The method includes receiving, from a system manufacturer, system test data for a plurality of electronic systems. Each of the plurality of electronic systems comprises a plurality of electronic components. The method also includes determining a relationship between a set of electronic components from the plurality of electronic components and the electronic systems upon which the electronic components of the set of electronic components are assembled and receiving, from a component manufacturer, manufacturing attributes for the set of electronic components. The method further includes selecting a data subset from the system test data corresponding to a subgroup of the set of electronic components. The subgroup comprises components from the same fabrication cluster. The method additionally includes identifying, for example, automatically, an outlier in the data subset. The outlier comprises an outlier relative to the data subset. The method also includes communicating the information about the outlier to at least one of the system manufacturer or the component manufacturer.

According to an embodiment of the present invention, a method of establishing a relationship between an electronic component and an electronic system upon which the electronic component is assembled is provided. The method includes receiving an identification of the electronic system. The electronic system includes the electronic component that has been picked up and placed on the electronic system. The method also includes receiving an identification of a reel from which the electronic component was picked up and placed on the electronic system. The reel includes the electronic component and a plurality of other electronic components arranged in a sequential order. The method further includes receiving positional information regarding a position of the electronic component within the sequential order in the reel, communicating the identification of the reel and the positional information to a manufacturer of the reel, receiving, from the manufacturer of the reel, an identification of the electronic component, and establishing a relationship between the electronic component and the electronic system.

The method can also include communicating the identification of the electronic component to a manufacturer of the electronic component and receiving, from the manufacturer of the electronic component, test data regarding operating characteristics of the electronic component based on the identification of the electronic component. Additionally, the method can include establishing a relationship between the test data for the electronic component and the electronic system.

According to a specific embodiment of the present invention, a method of determining a correlation between characteristics of an electronic system including a plurality of electronic components and characteristics of the plurality of electronic components is provided. The method includes receiving first data related to the characteristics of the electronic system and receiving second data related to the plurality of electronic components. The method also includes analyzing the first data and the second data to determine a relationship between the characteristics of the electronic system and the plurality of electronic components and determining, based on the analysis of the first data and the second data, the correlation between the characteristics of the electronic system and the characteristics of the plurality of electronic components. The plurality of electronic components can include semiconductor components. In an embodiment, the method further includes receiving an electronic test protocol related to the electronic system, forming an updated electronic test protocol based on the characteristics of the electronic components, and communicating the updated electronic test protocol to a manufacturer of the electronic system. It should be noted that the characteristics of the electronic system can be either characteristics that relate to failure of system tests by the electronic system or that relate to passing of system tests by the electronic system.

In an alternative embodiment, the method further includes receiving a semiconductor component test protocol related to the electronic components, forming an updated semiconductor component test protocol based on the characteristics of the electronic system, and communicating the updated semiconductor component test protocol to a manufacturer of the plurality of electronic components. The updated electronic component test protocol narrowed or broadened. The method may also include removing proprietary data from the characteristics of the plurality of electronic components.

According to another embodiment of the present invention, a method of providing data characterizing electronic system performance is provided. The method includes receiving first test data related to a first semiconductor device and receiving second test data related to a second semiconductor device. The first test data comprises a first range. Receiving the first test data can include receiving the first test data from a first semiconductor device manufacturer. Receiving the second test data can also include receiving the second test data from a second semiconductor device manufacturer.

The method also includes receiving system test data related to an electronic system including the first semiconductor device and the second semiconductor device. The system test data indicates failure of the electronic system. The method further includes determining, using the first test data, the second test data, and the system test data, that the first semiconductor device associated with a portion of the first range correlates with the failure of the electronic system. The method may additionally include communicating information associated with the first semiconductor device associated with a portion of the first range. Moreover, in an embodiment, the method includes removing proprietary data prior to communicating the information.

In an embodiment, the method also includes updating a protocol for the system test data based on determining that the first semiconductor device associated with a portion of the first range correlates with the failure of the electronic system. Updating the protocol can include removing one or more elements from the system test. Alternatively, updating the protocol comprises adding one or more elements to the system test.

According to a specific embodiment of the present invention, a method of providing data characterizing semiconductor device performance is provided. The method includes receiving semiconductor test data related to a semiconductor device. The semiconductor test data comprises a range. The method also includes receiving system test data related to an electronic system including the first semiconductor device. The system test data indicates failure of the electronic system. The method further includes determining, using the system test data, a first portion of the range and determining, using the system test data, a second portion of the range. The first portion of the range correlates with the success of the electronic system and the second portion of the range correlates with the failure of the electronic system. Further, the method includes forming a narrowed range excluding the second portion of the range.

In an embodiment, the semiconductor device is manufactured by a semiconductor manufacturer and the method further comprises communicating information associated with the narrowed range to the semiconductor manufacturer. In another embodiment, the electronic system is manufactured by an electronics manufacturer and the method further comprises communicating information associated with the narrowed range to the electronics manufacturer.

According to an embodiment of the present invention, a method of providing data characterizing semiconductor device performance is provided. The method includes receiving semiconductor test data related to a semiconductor device, wherein the semiconductor test data comprises a range and receiving system test data related to an electronic system including the first semiconductor device, wherein the system test data indicates success of the electronic system. The method also includes determining, using the system test data, an extended range, wherein the extended range correlates with the success of the electronic system and forming a broadened range including the extended range.

In relation to all of the embodiments described herein, as appropriate, the system can be a system that is not failed or can be an operable system that passes appropriate system specifications. Additionally, in relation to all of the embodiments described herein, as appropriate, the system test data can include system failure data or the system test data can include system performance data. In relation to all of the embodiments described herein, as appropriate, at least one of the system test data or the component test data can include numeric data or categorical data. In relation to all of the embodiments described herein, the substrate can include a silicon wafer or glass.

In relation to all of the embodiments described herein, as appropriate, the information about the outlier can identify the board to which the outlier corresponds or the component to which the outlier corresponds. In these examples, the correspondence can be based on the established relationship. In relation to all of the embodiments described herein, the method of identifying can include aggregating data subsets across multiple substrates or determining that a data subset includes a sufficient amount of data to perform a desired analysis. As an example that is applicable to all of the embodiments described herein, the method can include automatically identifying, which can include aggregating categorical data. The use of the term generating, in relation to all of the embodiments described herein, as appropriate, can include aggregating categorical data.

In relation to all of the embodiments described herein, as appropriate, the set of electronic components can include one or more of IC, chip, memory, battery, display, transmitter, receiver, MCP, MCM, 2D IC/SiP, circuit board, system, or module. Moreover, in relation to all of the embodiments described herein, as appropriate, the electronic system can include one or more of MCP, MCM, 2D IC/SiP, circuit board, system, module, or electronic product. As an example, that is applicable to all of the embodiments described herein, as appropriate, the test data of electronic systems does not include component test data.

Numerous benefits are achieved by way of the present invention over conventional techniques. For example, embodiments of the present invention provide services that are useful to both semiconductor device manufacturers and electronics manufacturers as well as other manufacturers. The terms component manufacturer and system manufacturer includes companies that fabricate, assemble, or test electronic components or systems and who can provide data related to these activities. In some cases, the term can be further expanded to include brand owners, including, but not limited to, test houses, assembly houses, and the like, who outsource fabrication, assembling, or testing to other companies, but who can provide data related to these activities. As discussed herein, semiconductor device manufacturers, also referred to as component manufacturers since the products are not limited to semiconductor devices, include manufacturers (sometimes referred to as contract manufacturers (CM) or original component manufacturers (OCM)) that fabricate individual passive components (e.g., transistors, resistors, and the like), and active components (e.g., integrated circuits, VLSI microchips, memory arrays, vacuum tubes, amplifiers, systems on a chip, LCD, LED, OLED, batteries, Photo Voltaic cells, fuel cells, sensors, MEMS devices, and the like). Electronics or systems manufacturers include manufacturers (sometimes referred to as original equipment manufacturers (OEM)) that assembly printed circuit boards, assemble systems, motherboards, daughter boards, plug-ins, expansion cards, assemblies, multi-chip packages (MCPs), multi-chip modules (MCMs), 2D IC/SiP, potted and encapsulated modules, battery modules, displays, solar panels, and the like. In some implementations, a company can be considered as a semiconductor device manufacturer for a first set of products, for example, selling, manufacturing, or testing integrated circuits, and as an electronics manufacturer for a second set of products, for example, selling printed circuit boards that include a number of discrete devices. In the second example, the products (e.g., printed circuit boards) can be considered as an individual component if they are utilized in upstream assembly operations (e.g., integration of a printed circuit board onto a motherboard including multiple printed circuit boards). One of ordinary skill in the art will appreciate that other manufacturers, while not specifically mentioned, will fall under the scope of the present disclosure.

Embodiments of the present invention provide methods and systems that result in reduced product returns, improvements in yield/quality, increases in testing efficiency, provide traceability, which can be utilized in demonstrating compliance, and design optimization through utilization and integration of component test data and system test data. These and other embodiments of the invention along with many of its advantages and features are described in more detail in conjunction with the text below and attached figures.

DETAILED DESCRIPTION OF SPECIFIC EMBODIMENTS

Figure 1:
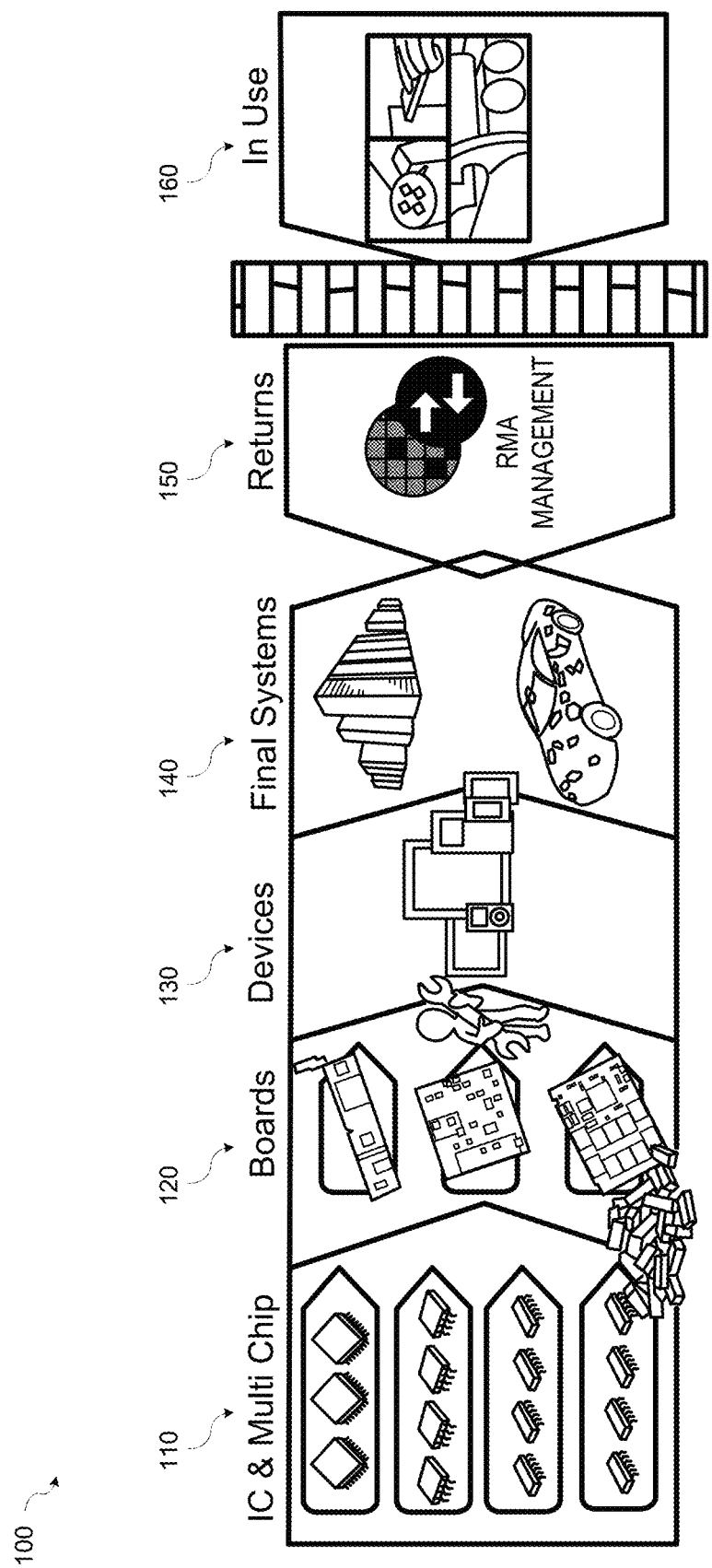
FIG. 1 is a flow diagram of product flow through a manufacturing network according to various aspects of the present disclosure.

Embodiments of the present disclosure relate to semiconductor manufacturing and the collection and analysis of data related to semiconductor devices and semiconductor manufacturing and assembly processes. More particularly, embodiments of the present disclosure provide a centralized data structure that is interconnected with sources and users of both semiconductor device manufacturing data and semiconductor system assembly data.

As described herein, embodiments of the present disclosure enable a correlation to be determined between system level tests, which can be referred to as Electrical Test, and component data, for example, but not limited to, component yield, bin/test, performance. This correlation can be utilized to modify or create new disposition strategies at the unit level. Moreover, this correlation can be used to hold marginal lots and/or wafers at the component manufacturer.

Embodiments of the present disclosure provide for sharing of product data, which is equivalent to adding product analytics to process analytics. The differences between product and process analytics are illustrated in Table 1 below.

TABLE 1

|  | Process Analytics | Product Analytics |
| --- | --- | --- |
| The "things" | Machines | Products |
| Outcome | Improved asset management | Improved product quality, performance, brand protection |
| Profit &Loss impact | Higher profit | Higher revenue AND profit |
| Beneficiaries | Manufacturer | Brand owner AND manufacturer |

Embodiments of the present invention provide a value chain quality network for sharing product data and product analytics that can provide both component manufacturers (e.g., OCMs) and equipment manufacturers (e.g., OEMs) with significant business values throughout the product lifecycle. These benefits include:
Improved quality and brand protection
Reduced customer returns and warranty costs
Improved new product introduction (NPI) and shortening of time to yield/quality
Improved engineering efficiency
Lowered cost by enabling smart binning By sharing of product data between the OEM and OCMs, it is possible to perform product analytics. Such analytics can find answers, for example, and without limitation, to the following questions:
What is common and what is different among systems that work well and systems that do not work well?
What is common and what is different among specific components used in systems that work well and components used in systems that do not work well?
Are there correlations between component behaviors and system behaviors?
Are there correlations between combinations of components (including from different OCMs) and system behaviors?
What are the parameters of components, combinations of components, and systems that have correlations (manufacturing dates or locations, test dates or locations, specific test results, functional or electrical parameters, etc.)?

This type of product analytics, made possible when system test data (also referred to as board data for printed circuit boards) and component test data (also referred to as chip data) are shared, can find patterns and/or correlations in what otherwise seem like random problems. Accordingly, embodiments of the present disclosure benefit both OEMs and OCMs as they improve NPI, save engineering time, and shorten time-to-market, time-to-yield, and time-to-quality. In the embodiments described herein, system test data is utilized that is based on the functionality of the various components integrated into the system, but is system-centric because it depends on the performance of the system as a whole, not the test data for the individual components, which can be referred to as component test data.

Utilizing embodiments of the present disclosure, the sharing of product data between OCMs and OEMs can result in the introduction of higher quality into the design and NPI phases. When a problem does happen in the field, sharing data can minimize the damage considerably, as here too, product data analytics that cover both OCMs and OEMs can quickly turn what may initially seem like random problems to insights into the root cause. Such analytics can shed light on questions such as:
What is unique about problematic products?
How do they differ from the good products?
Has anything changed in the final product or in any of its components?
Are there correlations between changes in component or in component combinations and system behaviors?
Are changes related to manufacturing dates or locations, test dates or locations, specific test results, etc.?

Sharing product data between OEMs and OCMs is valuable, not only when system performance issues are encountered, but it can also improve cost and efficiency in other ways, including smart binning. Binning—defining different part numbers with different prices based on component test results—is a common practice in semiconductor manufacturing and testing. However, most conventional binning is very coarse, based on just one or two parameters, for example, clock frequency. In a high volume system, if the OEM and OCMs perform product analytics on shared data, binning can be "smarter" with significant benefits for both sides. Such analytics can identify the following:
Component parameters to which the system is sensitive, allowing the OEM to tune the system design or suggest to the OCM not to ship certain components to the specific system.
Component parameters that do not affect the specific system, allowing shipping components that otherwise would not be shipped, thus improving OCM yield.
Component tests that are irrelevant for the specific system, allowing lower cost through Test Time Reduction (TTR).

One of ordinary skill in the art will appreciate that this is not an exhaustive list.

As discussed in relation to FIG. 2 below, embodiments of the present disclosure provide an analytics system that connects OEMs and OCMs and is managed and operated by a trusted 3rd party, which manages data and performs analytics and can provide the values of sharing product data while addressing the associated challenges. As example, the analytics system can manage the data sharing operation as follows:
By having domain expertise in both semiconductors and systems the $3^{rd}$ party can perform analytics for both the OEMs and the OCMs, eliminating the need for both to develop expertise in the other domain.
By working with many OCMs and OEMs, the $3^{rd}$ party has visibility into which components are used by which systems (genealogy) and can ensure analytics are done on all the relevant products, for example, only on them.
The $3^{rd}$ party can guarantee to all parties what data and/or analytics results will be shared, alleviating the concern about OEMs getting sensitive data from the OCMs and vice versa. For example, the $3^{rd}$ party can guarantee that only insights based on specific analytics will be shared, with no data at all moving between OCM and OEM in some implementations.
The $3^{rd}$ party can implement state-of-the-art security measures to ensure data in the hub is properly secure, relieving the OEMs and OCMs from the need to address security if they received sensitive data from the other party.

In summary, aspects of the present disclosure leverage sharing of product data and product analytics in order to provide both OEMs and OCMs with significant business values throughout the product lifecycle. The various aspects enable insights not possible if analytics on OCM products and OEM products are done in silos, thus turning what may seem like random issues or results into meaningful patterns and correlations. Sharing product data delivers many business values, including improving quality and brand protection, reducing customer returns and warranty costs; improving NPI and shortening time to yield/quality, improving engineering efficiency, and lowering cost by enabling smart binning.

FIG. 1 is a flow diagram of product flow 100 through a manufacturing network according to various aspects of the present disclosure. As illustrated in FIG. 1, components, which can include integrated circuits and multi-chip modules 110, are produced. Test data associated with these components, which can be referred to as component test data, is collected.

In some embodiments, reference is made to component test data being received from the component manufacturer. However, as described below, the embodiments of the present disclosure are not limited to this arrangement. In some embodiments, the component manufacturer may not test the components, since the components may be tested by third parties, effectively outsourcing the testing function. Thus, the terms component manufacturer, system manufacturer, and the like are not intended to limit the functions that these entities can perform since different functions can be performed by one or more entities. As an example, component test data can be received from the component manufacturer, a contract test company working in conjunction with the component manufacturer, the system manufacturer, who may test components in advance of system assembly, or the like. Thus, receipt of data is not limited to the entity that manufactured the item under test and data can be received from entities other than the manufacturer.

The components are provided to an equipment manufacturer (OEM), which assembles the components into systems, for example, printed circuit boards 120. Test data is collected at this stage and referred to as system test data. In a manner similar to component test data, the system test data may be collected by the equipment manufacturer, a contract test company, other third parties, or the like. Devices 130 and final systems 140 are assembled, which may both be tested during and after manufacturing, and delivered to users. Returns 150 may occur as part of use 160 by users.

Figure 2:
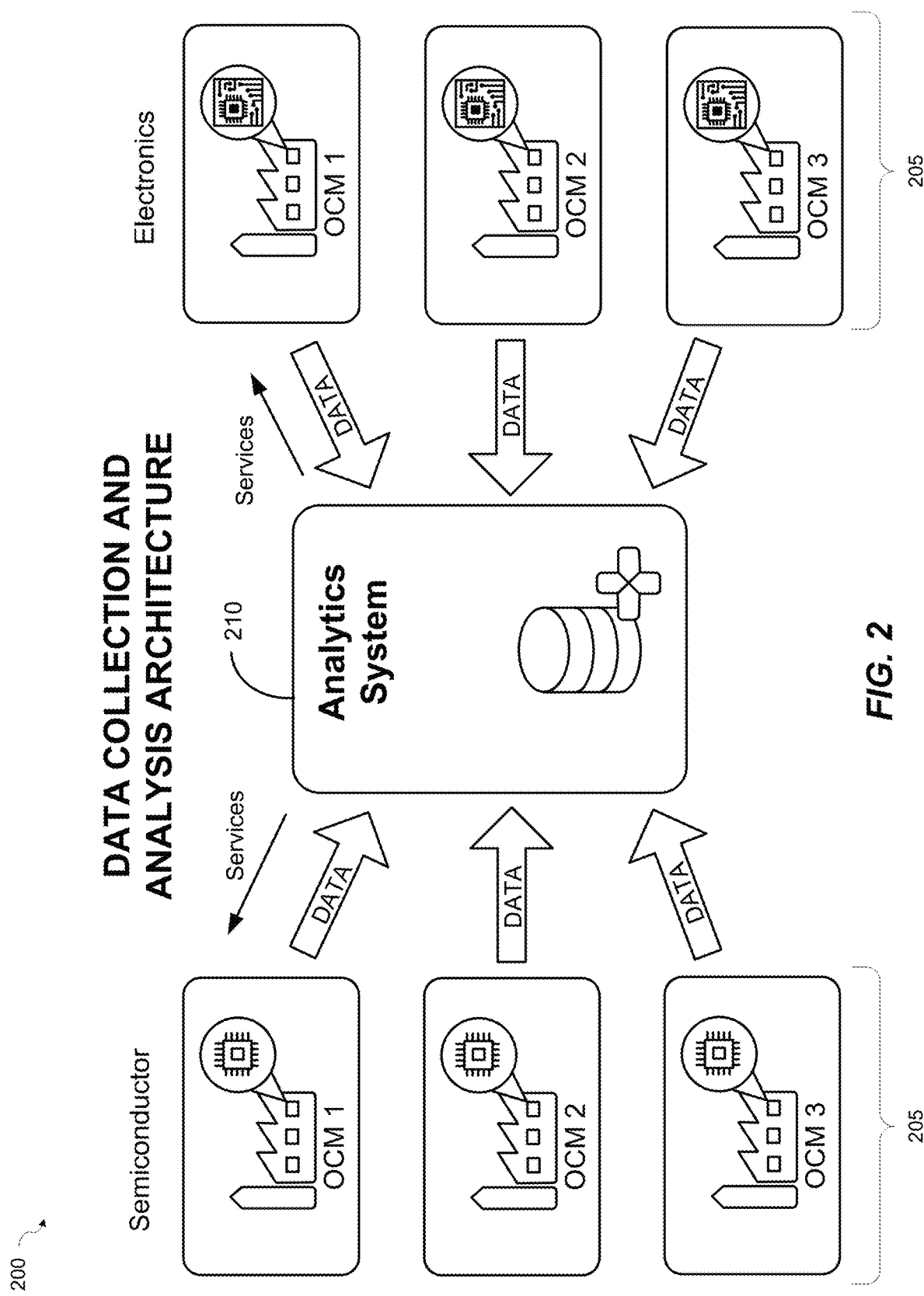
FIG. 2 is a diagram of an integrated data collection and analysis system according to various aspects of the present disclosure.

FIG. 2 is a diagram of an integrated data collection and analysis system 200 according to an aspect of the present disclosure. As illustrated in FIG. 2, various semiconductor, electronics, or component manufacturers 205, also referred to as an original component manufacturer (OCM), manufacture components and provide data related to the components to analytics system 210.

The set of electronic components can include IC, chip, memory, battery or battery cell, display, transmitter, receiver, MCP, MCM, 2D IC/SiP, PCB, circuit board, system, or module. One of ordinary skill in the art will appreciate that this is not an exhaustive list of electronic components and that other electronic components may be included without departing from the scope of the present disclosure.

The data related to the components can include one or more of the following:
  IC/Component Information
  Full Test Data
  Inkless Map (lot, wafer, x, y, bin)
  Genealogy Information (Serial Number)
  Partial Genealogy Information (Lot #, Batch #, . . . )
  Error Code (Bin)
  Test (and re-test) Data
  MES information One of ordinary skill in the art will appreciate that this is not an exhaustive list of related data and that other data may be included without departing from the scope of the present disclosure.

As additionally illustrated in FIG. 2, the analytics system 210 provides services to the one or more component manufacturers. As an example, during new product introduction (NPI), information provided as a component of the services can enable the OCM to improve yield by tailoring the disposition scheme to the specific electronics application. Examples of this tailoring include reducing the frequency of loss (e.g., less outlier kill, wider test limits, and the like).

Referring to FIG. 2 again, equipment manufacturers, also referred to as an original equipment manufacturers (OEM), manufacture systems using the components provided by the component manufacturers and provide data related to the manufactured systems to analytics system 210.

The set of electronic systems can include battery, multi-chip package, (MCP), multi-chip module (MCM), two-dimensional integrated circuit/system in package (2D IC/SiP), printed circuit board (PCB), circuit board, system, module, or electronics product. One of ordinary skill in the art will appreciate that this is not an exhaustive list of electronic systems and that other electronic systems may be included without departing from the scope of the present disclosure.

The data related to the systems can include one or more of the following:
  Board Test Data
  Return Merchandise Authorization (RMA)/failure data
  In-use Data One of ordinary skill in the art will appreciate that this is not an exhaustive list of related data and that other data may be included without departing from the scope of the present disclosure.

As additionally illustrated in FIG. 2, the analytics system 210 may provide services to the OEMs. These services can include information that enables the OEM to implement a wide range of quality controls on incoming components, including, without limitation, outlier detection, escape prevention, and the like. Additional services can include information that enables the OEM to identify incoming parts with characteristics that can impact the performance of systems designed to implement specific electronics applications (e.g., components that can cause excessive failures of the system.

In some implementations, the services may include information that enable the OCM and/or OEM to differentiate between product performance results that are caused by the electronics assembly process and those that are caused by a component in the system, and thereby simplifying root-cause-analysis. This can be of particular advantage in relation to NPI. The ability to identify the characteristics of IC's, or groups of IC's, such as escapes, that could not be identified without access to the electronics data may be provided by embodiments of the present disclosure.

In accordance with various aspects of the present disclosure, a quality index may be generated by the analytics system 210. The quality index may be provided as a service to the OCMs. As an example, since the analytics system 210 receives system test data from an OEM that can include component traceability, i.e., identifiers for the particular components used in the system, as well as data on the particular components from the OCM, a quality index can be generated for the components that indicates the likelihood of success at the system level, which may be measured, not in terms of system failure, but in terms of the system performance, for example, operating frequency, thermal performance, or the like. The component data can include not only performance data on specific components, but meta-data relating specific components to other components in the fabrication lot. Thus, OCMs are provided with information related to system performance when the components are utilized, which can be utilized to supplement the component performance data, also referred to as performance test data, already available to the OCM. Using this information, components with low quality indexes can be binned differently, utilized in different products, or the like.

Additional services that can be provided to either the OCM or the OEM may include services related to new product introduction (NPI) and ramp acceleration, thereby reducing time to quality and/or time to market. These services can use templates to speed analysis. As an example, the OEM and/or OCM can update test limits and operating windows. It is also possible to adjust GO and Quality rules.

Moreover, embodiments of the present disclosure are useful in defining a quality firewall, which can improve and sustain yield and quality for high volume manufacturers. For example, it is possible to implement semiconductor quality solutions on incoming material, which are tuned by system performance, which can be measured at system (e.g., board) test. Additionally, it is possible to set up outlier detection to evaluate only the tests that impact the system performance. Rebinning or holding of wafers/lots before assembly can be implemented. Additionally, the disposition scheme can be changed in addition to servicing of customer equipment in the case of PnP at the customer site.

Failure Analysis (FA) is enabled by embodiments of the present disclosure, thereby explaining and minimizing field failures and returns. By providing periodic (e.g., constant) analysis of system test failures and RMAs against component test data, it is possible to detect correlations to component test data that explain failures. In some embodiments, it is possible to create alerts related to new issues and create new rules that can be implemented in relation to the Quality Firewall.

As discussed herein, adaptive system and/or component tests may be enabled by various aspects of the present disclosure, reducing the cost of the system/component tests. Analytics on correlations can be performed to determine opportunities for reduced testing of systems and/or generating a "probability index" or "quality index" for both components and/or systems. The testing protocols can thus be adjusted based on system inputs, including the probability index or quality index. Tests can be reduced, eliminated, increased, or the like.

The position of the analytics system 210 between the component manufacturers and the equipment manufacturers enables services that are not available using conventional techniques. Accordingly, embodiments may include receiving component data from the component manufacturer (e.g., performance data on the components) and receiving system test data from the equipment manufacturer, which can include genealogy data on components that are integrated in particular systems. The system test data and component data can be utilized to build a model correlating the system performance to the component data. Services provided to the component manufacturer can include data used to tighten or reduce specification boundaries. Services provided to the equipment manufacturer can include data used to change how the systems are assembled or applications in which the systems are utilized. Additionally, increased or modified testing can be implemented based on data produced by a system.

As an example, the system tests can be modified using according to various aspects of the present disclosure. For instance, the correlation between the system performance tests and the component performance tests, for the components used in the system, produced by the analytics system 210, can be used to reduce the amount or level of system testing, thereby saving time and reducing cost for the OEM. Based on the historical data collected and developed by the analytics system 210, a determination can be made that one or more test protocols associated with the system testing can be eliminated, reduced, increased, added, or the like. In an example, history on a system test for systems with a particular component having a specific characteristic could be used to determine that the system test is not necessary since the pass rate of previous system tests exceeded a threshold. In contrast, if a particular component has another specific characteristic, this fact could be used to determine that an additional system test is necessary since the failure rate for previous system tests exceeded a threshold. Thus, various modifications of the system test protocols are included within the scope of the present disclosure. One of ordinary skill in the art would recognize many variations, modifications, and alternatives.

In addition to modification of test protocols, systems incorporating specific components can be utilized in different applications based on results produced by the analytics system 210. As an example, if a correlation between system tests and component tests indicates a potential, but unlikely, system failure, then this system can be placed in an application where a limited chance of failure is acceptable. Other systems would be placed in applications, for example, medical devices, where the mean time to failure standards are more stringent. Thus, overall system deployment can be increased while meeting mean time to failure standards.

It should be noted that the systems can include components from multiple OCMs. Accordingly, the analytics system 210 may provide the ability to remove confidential or sensitive data from the component data to ensure that confidential data from a first OCM is not passed to a second OCM. Similarly, confidential or sensitive data can be removed from system test data to ensure that confidential data from a first OEM is not passed to a second OEM.

As an example, the component specifications can specify that a component is within specification, but is an outlier with respect to similar devices. Using embodiments of the present disclosure, the system test data may indicate that for this particular outlier, adverse impacts are observed at the system level, indicating that the particular component should not be utilized in system assembly. This effectively narrows the range of the component specification as a function of the electronic system characteristics.

Figure 3A:
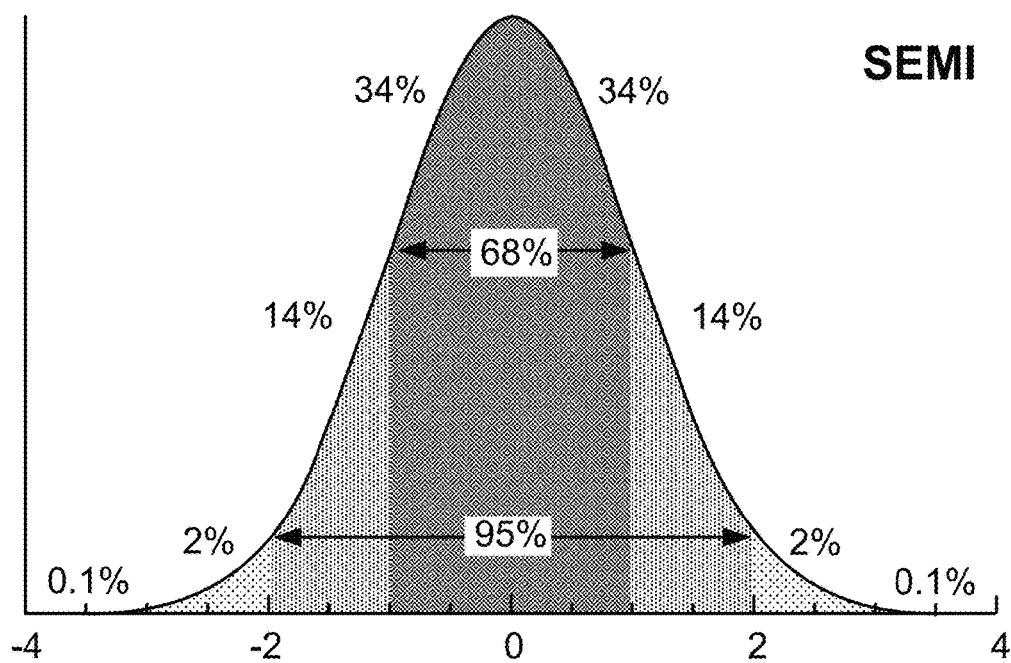
FIG. 3A is a histogram of parametric test results according to various aspects of the present disclosure.

FIG. 3A is a histogram 300 of parametric test results according to various aspects of the present disclosure. In FIG. 3A, the distribution of test results is presented in relation to the deviation from the average. Typically, a Dynamic Part Average Test (DPAT) will be used to separate components that fall outside of a range of ±3.5 σ. Accordingly, the yield loss for the components can be on the order of 3%.

Figure 3B:
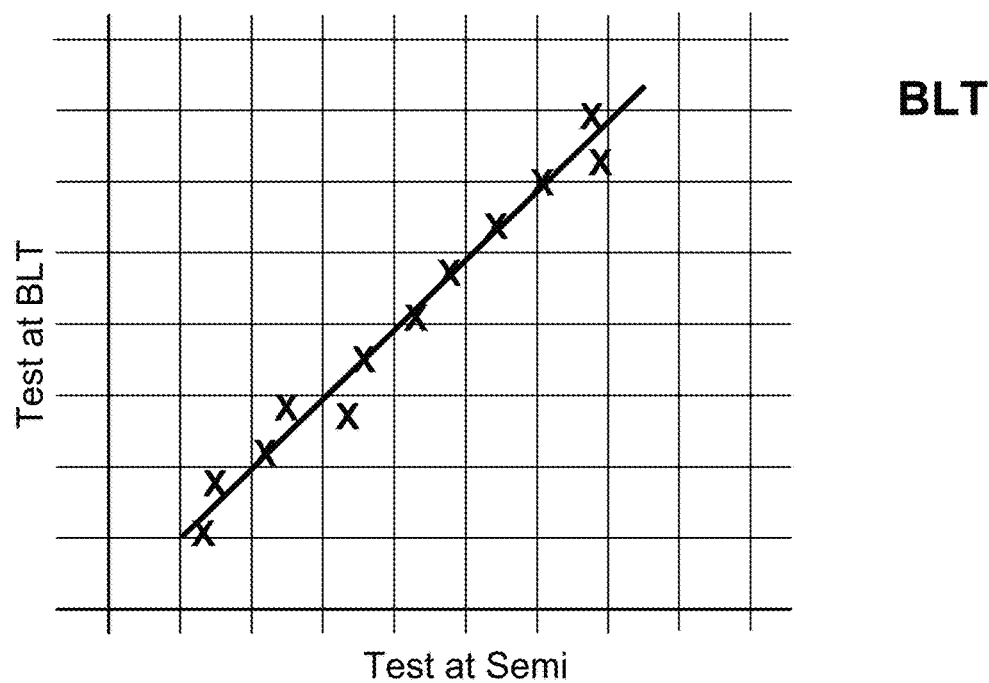
FIG. 3B is a plot illustrating board level test results as a function of semiconductor device test results according to various aspects of the present disclosure.

FIG. 3B is a plot 350 illustrating system test results (also referred to as board level test results) as a function of component (e.g., semiconductor device) test results according to various aspects of the present disclosure. As an example, analyzing the correlation between component performance and system performance, it can be determined that a subset of the component parameters have a significant impact on system yield (i.e., board yield). Accordingly, the DPAT for the subset of component parameters can be tightened (e.g., ±3.5 σ) and loosened for the remaining component parameters (e.g., ±3.5 σ). As a result, the component yield loss can be decreased while improving the system yield. Although a single variation is illustrated in FIG. 3B, one of ordinary skill in the art will appreciate that multivariate analysis or other analysis is included within the scope of the present disclosure.

Figure 4A:
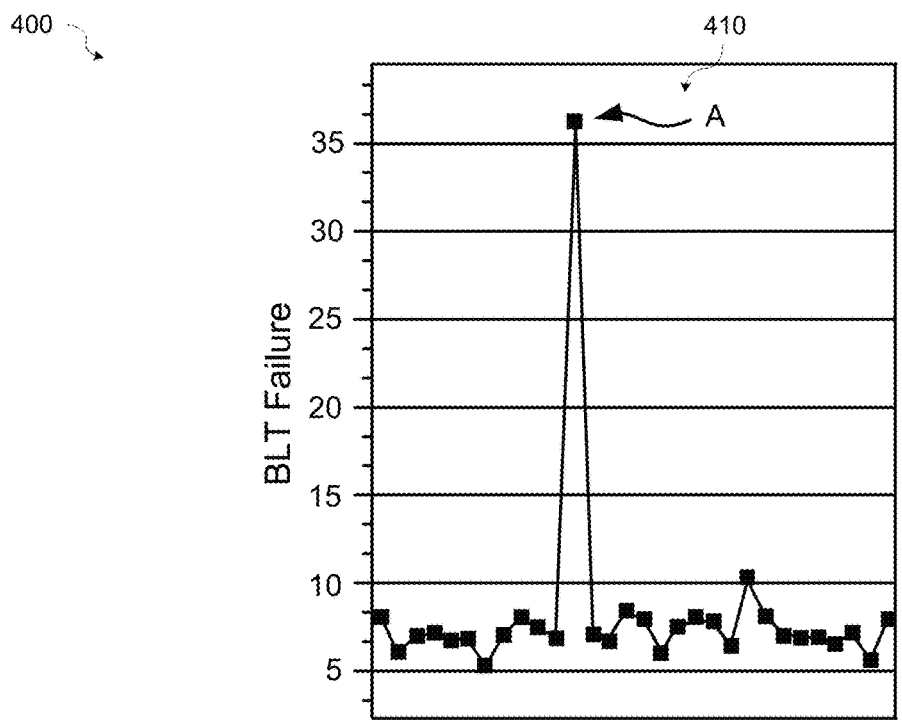
FIG. 4A is a plot illustrating board level test results as a function of fabrication lot according to various aspects of the present disclosure.

FIG. 4A is a plot 400 illustrating board level test results as a function of fabrication lot according to various aspects of the present disclosure. The board level test (BLT) results, which are system test results, indicate a low level of failure with the exception of boards assembled using components from fabrication lot A 410. For this fabrication lot, the components resulted in the system level failures. Typically, the OEM does not have lot information since the OCM does not typically share lot information as component yield can be determined using lot information.

Figure 4B:
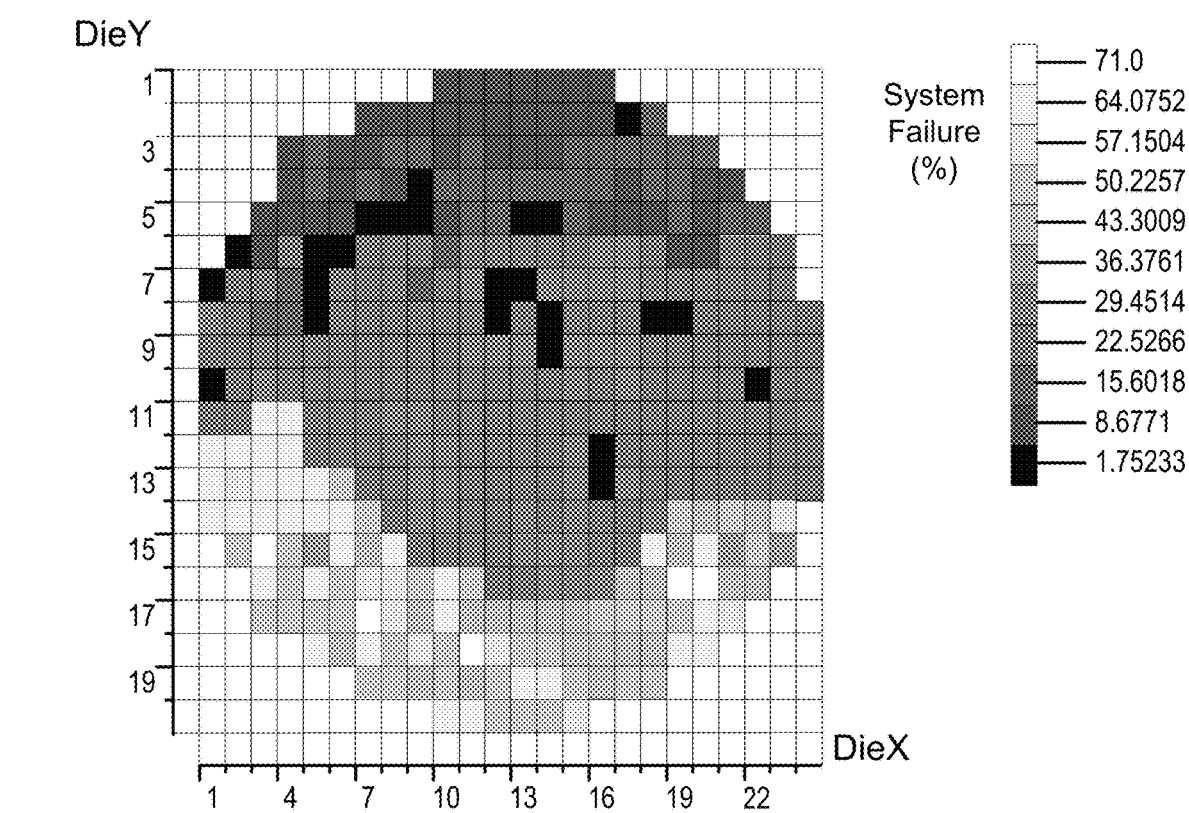
FIG. 4B is a reconstructed wafer map illustrating semiconductor device yield loss as a function of wafer position according to various aspects of the present disclosure.

FIG. 4B is a reconstructed wafer map 450 illustrating semiconductor device yield loss as a function of wafer position according to various aspects of the present disclosure. In FIG. 4B, a performance characteristic of the systems assembled using components from fabrication lot A is graphically illustrated as a function of the component position on the wafer. In other words, the reconstructed wafer map in FIG. 4B plots the location of components on the wafer, received from the OCM, as a function of system performance, received from the OEM, for the system incorporating the component at each location.

As shown in FIG. 4B, use of the components from a first side of the wafer (i.e., the top of the wafer map) result in low values (0-20%) for system failure. On the contrary, the use of components from the opposing side of the wafer (i.e., the bottom of the wafer map) during system assembly results in systems that are characterized by high values for system failure (40%-70%). Thus, although all the components met the design specifications specified by the OCM, once the components are assembled in the system, system failure occurs at a significantly higher level when using components from one portion of the wafer in comparison with components from another portion of the wafer.

One use of the data illustrated in FIGS. 4A and 4B is to notify the OEM to not build additional systems including components from portions of fabrication lot A since, although the components meet the specification, system failure will likely occur. Another use of the data illustrated in FIGS. 4A and 4B is to notify the OCM that if wafer maps similar to that shown in FIG. 4B are measured, it could be advisable to not ship the components from the fabrication lot in conjunction with a particular system since they will likely produce system failure for these certain systems. As an example, the components from this fabrication lot can be utilized in other systems in which the component characteristics will not result in system failure. Alternatively, components meeting a tighter performance specification can be shipped rather than the entire lot.

Because performance specifications for the various component fabrication lots are not typically available to the system assemblers, the analysis that resulted in the reconstructed wafer map in FIG. 4B is not able to be performed. In contrast with these conventional techniques, various aspects of the present disclosure enable the integration of component test data and system test data and the attendant benefits as illustrated herein. Although FIGS. 4A and 4B illustrate electrical test yield loss (and bin/test) that is reconstructed and analyzed by fabrication lot for each component, embodiments of the present disclosure are not limited to this exemplary analysis. In a more general implementation, specific patterns (e.g., geographic and/or parametric) present in the components can be correlated to OCM quality and/or performance and be addressed by either OCMs, OEMs, or both.

Figure 5A:
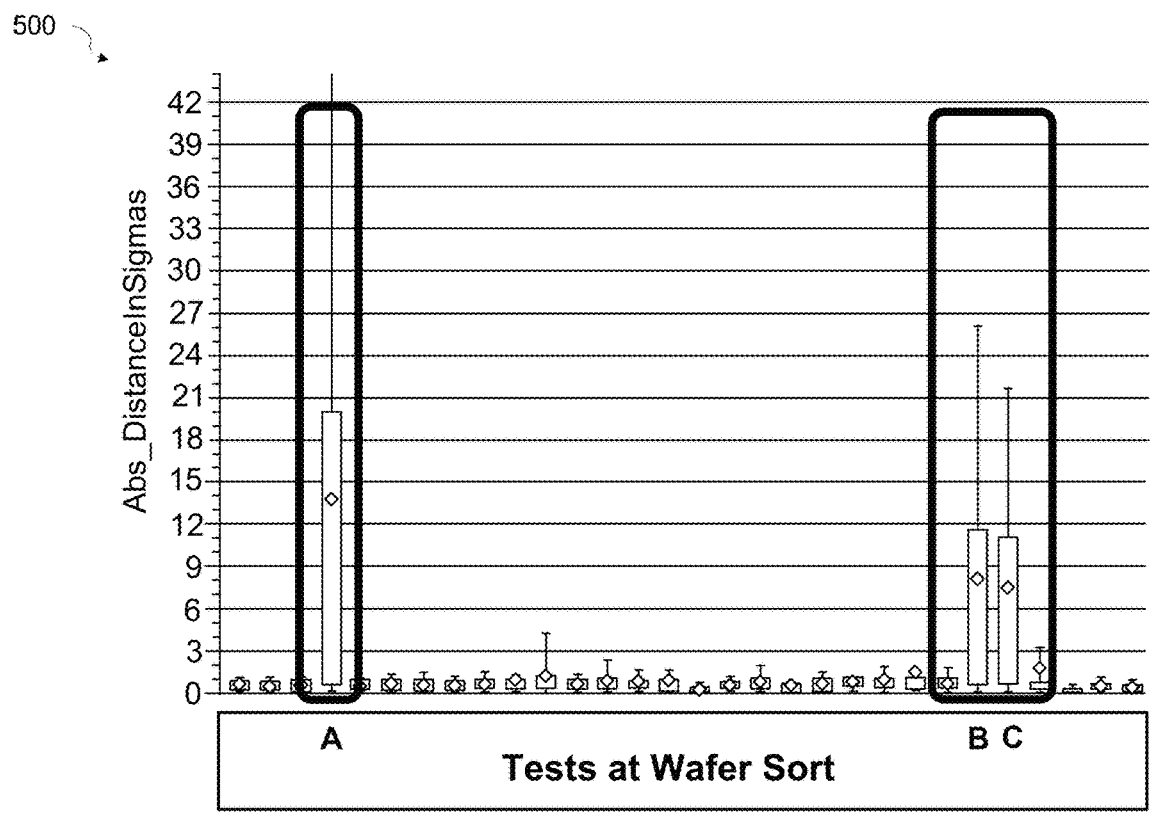
FIG. 5A is a histogram of the distribution of test results according to various aspects of the present disclosure.
Figure 5B:
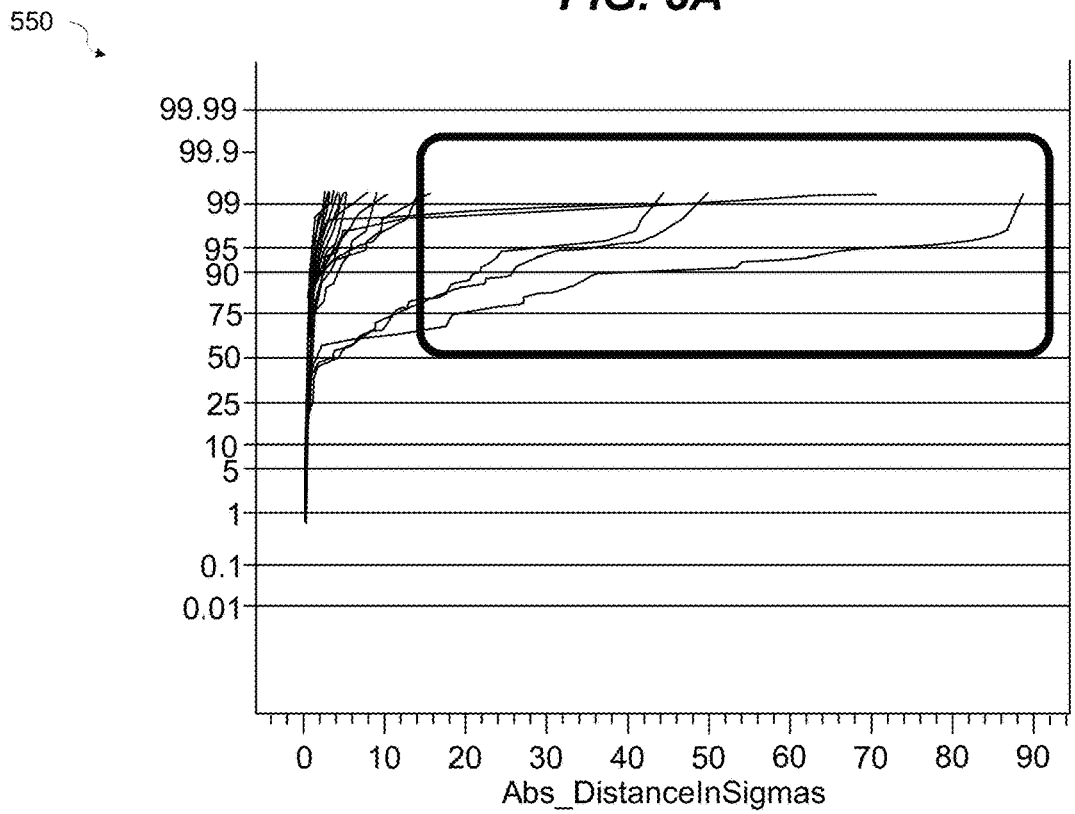
FIG. 5B is a normalized quintile plot of the distribution of test results according to various aspects of the present disclosure.

FIG. 5A and FIG. 5B are a histogram 500 and a normalized quintile plot 550 of the distribution of test results, respectively, according to various aspects of the present disclosure. In FIG. 5A, the distance between wafer sort test results, normalized in number of sigma, between components from boards with different board level test results, e.g., boards with a different error code, passing boards and failing boards, boards with different bins, and the like, is plotted as a function of tests at wafer sort performed by the OCM. As described herein, wafer sort tests with tails can be identified. The width of the distribution in system performance is high for tests A, B, and C. Accordingly, the correlation between system performance and a particular test parameter for a component can be determined. In other words, FIGS. 5A and 5B highlight the component tests with highest impact on the board performance.

For test A, the variability in component test results in a large variability in system performance. This analysis can also be implemented in relation to error codes. Thus, the correlation can be numeric to categorical (e.g., failure/success).

In some embodiments, all tests at wafer sort are correlated against each Error Code. It has been determined that some tests exhibit different parametric values on systems with high performance in comparison with systems with poor (e.g., failing) performance. In FIGS. 5A and 5B, the calculated value shows the distance (in sigma or other suitable deviation) of the system performance values per test. Data can be calculated separately for each fabrication lot and/or for each wafer.

Figure 6:
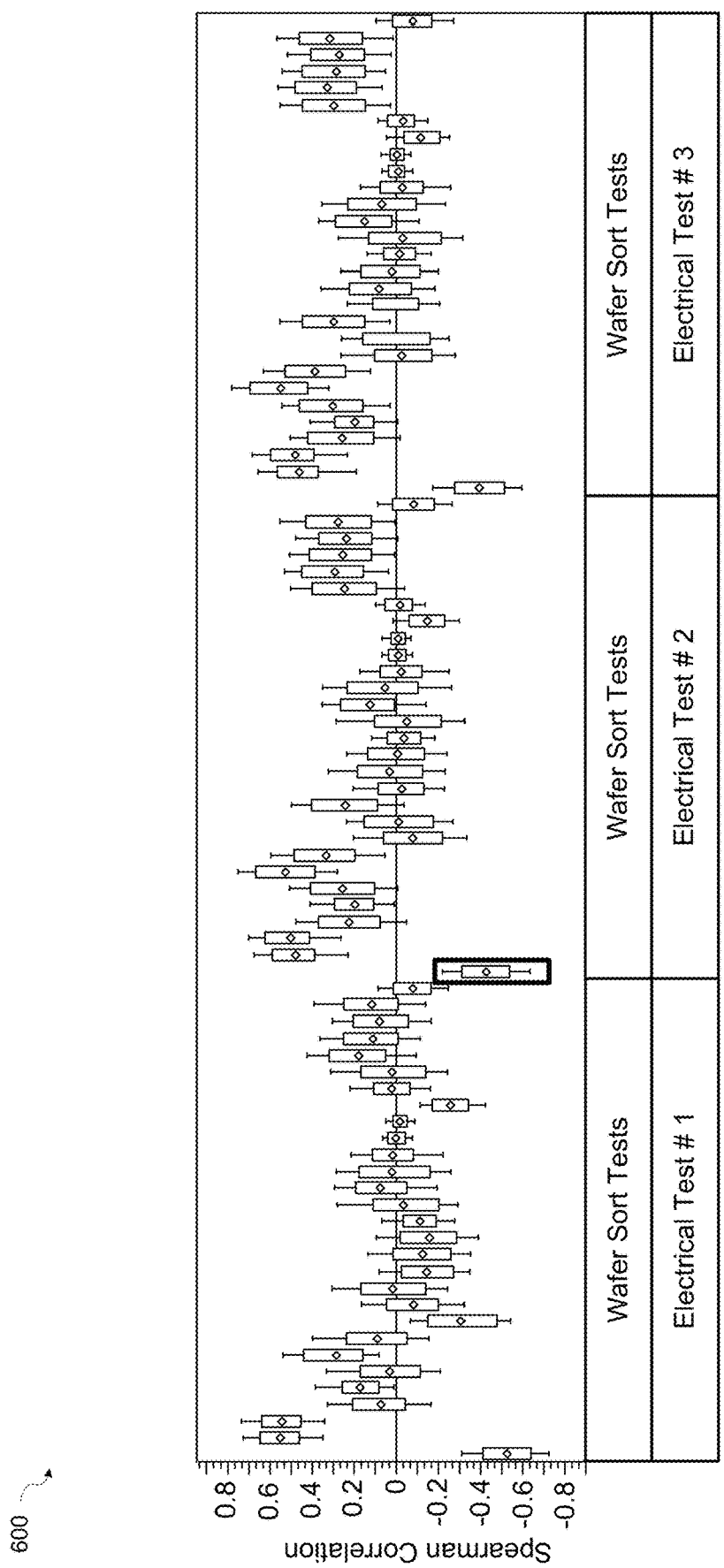
FIG. 6 is a bar chart illustrating correlation between semiconductor device test results and electronics manufacturing test results.

FIG. 6 is a bar chart 600 illustrating correlation between semiconductor device test results and electronics manufacturing test results. In FIG. 6, the best correlations between some of the wafer sort parameters or tests to some of the parameters measured at electrical test (i.e., system level test) are shown. The data is aggregated per Wafer Sort for each wafer. As described herein, such correlations can be used to help predict the Electrical Test (i.e., system level) performance.

In FIGS. 7-11, embodiments are discussed in which the genealogy of the system (e.g., board) is utilized in which the various components incorporated into each system are known. As an example, a first electronic system (e.g., board) includes the following components: power supply (PSU) a1, CPU b1, memory c1, transmitter d1, and GPU e1. These components a1-e20 can be referred to as a plurality of components. In the exemplary methods discussed herein, the following genealogy in Table 2 is utilized to provide suitable examples.

TABLE 2

| Board ID | Components (a -PSU, b -CPU, c -memory, d -transmitter, e -GPU) |
|---|---|
| 1 | [a1, b1, c1, d1, e1] |
| 2 | [a2, b2, c2, d2, e2] |

TABLE 2-continued

| Board ID | Components (a -PSU, b -CPU, c -memory, d -transmitter, e -GPU) |
|---|---|
| 3 | [a3, b3, c3, d3, e3] |
| 4 | [a4, b4, c4, d4, e4] |
| 5 | [a5, b5, c5, d5, e5] |
| 6 | [a6, b6, c6, d6, e6] |
| 7 | [a7, b7, c7, d7, e7] |
| 8 | [a8, b8, c8, d8, e8] |
| 9 | [a9, b9, c9, d9, e9] |
| 10 | [a10, b10, c10, d10, e10] |
| 11 | [a11, b11, c11, d11, e11] |
| 12 | [a12, b12, c12, d12, e12] |
| 13 | [a13, b13, c13, d13, e13] |
| 14 | [a14, b14, c14, d14, e14] |
| 15 | [a15, b15, c15, d15, e15] |
| 16 | [a16, b16, c16, d16, e16] |
| 17 | [a17, b17, c17, d17, e17] |
| 18 | [a18, b18, c18, d18, e18] |
| 19 | [a19, b19, c19, d19, e19] |
| 20 | [a20, b20, c20, d20, e20] |

Embodiments of the present disclosure relate to Geographic Part Average Test (GPAT) and Nearest Neighbor Residual (NNR). As an example, one outlier on a given area of one wafer can be determined, for example, one bad die on wafer edge compared to the rest of wafer edge. This can also be referred to as a bad die in a good neighborhood (BDGN).

Alternatively, embodiments of the present disclosure may be used to determine a good die in a bad neighborhood (GDBN). Given a number of dies, which, during manufacturing, were next to each other on a substrate or wafer, embodiments may determine which of these dies are good in comparison to the dies adjacent the good dies during manufacturing. It could be assumed that since the number of dies originated from the same area on the substrate, the performance of the systems into which they are integrated will be similar. However, by examining the system test results, particularly a subset of the test results, not only the system, but the die can be determined as an outlier.

Figure 7A:
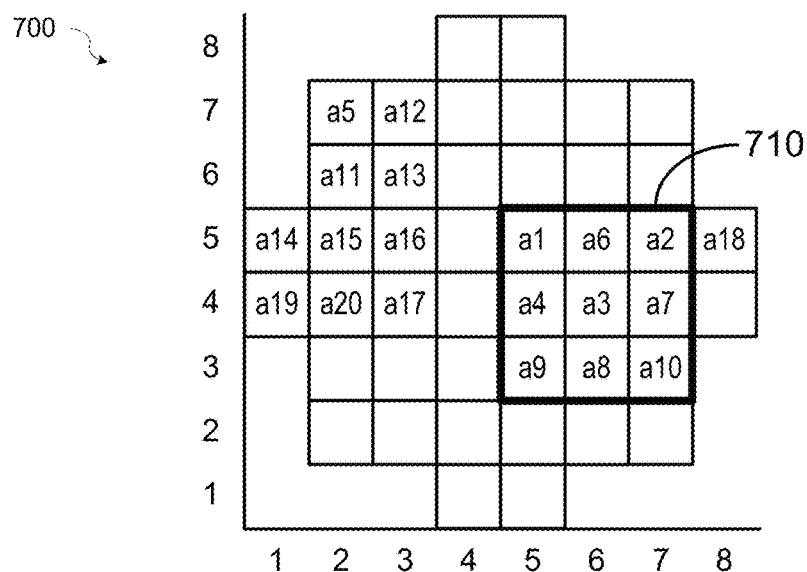
FIG. 7A is a diagram illustrating a substrate with labeled components according to various aspects of the present disclosure.

FIG. 7A is a diagram illustrating a substrate 700 with labeled components according to various aspects of the present disclosure.

The manufacturing attributes for a set of components, e.g. PSU's a1-a20 can be correlated with the wafer coordinates. This correlation can include the attributes containing or being converted to wafer coordinates as shown in Table 3.

TABLE 3

| PSU | X | Y |
|---|---|---|
| a1 | 5 | 5 |
| a2 | 7 | 5 |
| a3 | 6 | 4 |
| a4 | 5 | 4 |
| a5 | 2 | 7 |
| a6 | 6 | 5 |
| a7 | 7 | 4 |
| a8 | 6 | 3 |
| a9 | 5 | 3 |
| a10 | 7 | 3 |
| a11 | 2 | 6 |
| a12 | 3 | 7 |
| a13 | 3 | 6 |
| a14 | 1 | 5 |
| a15 | 2 | 5 |
| a16 | 3 | 5 |
| a17 | 3 | 4 |
| a18 | 8 | 5 |
| a19 | 1 | 4 |
| a20 | 2 | 4 |

In FIG. 7A, substrate 700 (also referred to as a wafer) is illustrated, with components and their spatial position on the substrate identified by component identifiers a1 through a20. As illustrated in FIG. 7A, sets of components that are a subset of the total number of components can be identified by separate areas. As an example discussed here and below, the set of components can be components a1-a20. A subgroup of the components can be: a1, a2, a3, a4, a6, a7, a8, a9, and a10. A data subset of the subgroup of can be: system power for systems containing a1, a2, a3, a4, a6, a7, a8, a9, and a10. Area 710 including components a1, a2, a3, a4, a6, a7, a8, a9, and a10 is highlighted. Other areas may be defined including a larger number of a smaller number of components. As an example, components a1-a20 can be power supplies. Data on the manufacturing attributes of each of the components is provided by the component manufacturer, test company, or the like. In another embodiment, data on the performance characteristics of each of the components is provided by the component manufacturer, test company, or the like.

A subgroup of the set of components may be created, providing a list of adjacent components (PSU's) based on X and Y coordinates as shown in Table 4. The data subset may include data related to one or more performance characteristics of the system, for example, power consumption. Using this data subset, not all the system test data is analyzed, but only a selected subset of the system test data may be analyzed. This data subset may be related to a particular type of electronic component, for example, the power performance of the system when analyzing a power supply component. The area of the substrate will have been populated with a given type of component, for example, a power supply.

TABLE 4

| X | Y | PSU |
|---|---|---|
| 5 | 5 | a1 |
| 7 | 5 | a2 |
| 6 | 4 | a3 |
| 5 | 4 | a4 |
| 6 | 5 | a6 |
| 7 | 4 | a7 |
| 6 | 3 | a8 |
| 5 | 3 | a9 |
| 7 | 3 | a10 |

A data subset (subgroup of set of components and corresponding board test data-power) may be selected as shown in Table 5.

TABLE 5

| PSU | Board ID | Test1 Power |
|---|---|---|
| a1 | 1 | 10 |
| a2 | 2 | 11 |
| a3 | 3 | 4 |
| a4 | 4 | 9 |
| a6 | 6 | 12 |
| a7 | 7 | 11 |
| a8 | 8 | 12 |

TABLE 5-continued

| PSU | Board ID | Test1 Power |
|-----|----------|-------------|
| a9  | 9        | 10          |
| a10 | 10       | 9           |

In contrast with techniques that identify components as outliers based on component data, various aspects of the present disclosure as described more fully herein may utilize system test data for systems incorporating specific components to identify components as outliers.

Figure 7B:
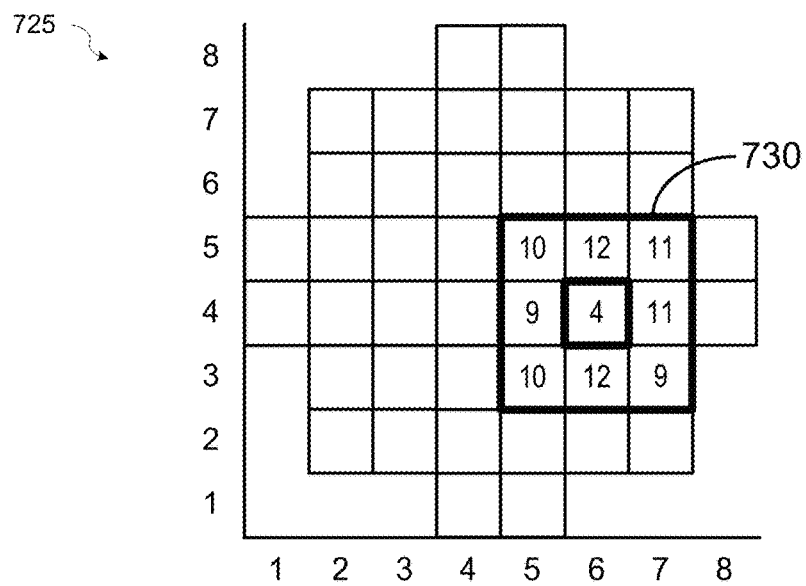
FIG. 7B is a diagram illustrating system test results for systems incorporating components from an area of the substrate according to various aspects of the present disclosure.

FIG. 7B is a diagram illustrating system test data 725 for systems incorporating components from an area 730 of the substrate according to various aspects of the present disclosure. The area 730 of the substrate in FIG. 7B corresponds to the area 720 of the substrate in FIG. 7A.

As illustrated in FIG. 7B, system test data 725 is shown correlated with the location on the substrate of the component incorporated into each system that is tested. Thus, the relationship between the set of components and the systems incorporating the components of the set is available as shown in Table 6.

TABLE 6

| Board ID | PSU |
|----------|-----|
| 1        | a1  |
| 2        | a2  |
| 3        | a3  |
| 4        | a4  |
| 5        | a5  |
| 6        | a6  |
| 7        | a7  |
| 8        | a8  |
| 9        | a9  |
| 10       | a10 |
| 11       | a11 |
| 12       | a12 |
| 13       | a13 |
| 14       | a14 |
| 15       | a15 |
| 16       | a16 |
| 17       | a17 |
| 18       | a18 |
| 19       | a19 |
| 20       | a20 |

In this embodiment, multiple power supplies, one from each of the nine systems (e.g., boards) are considered. Referring again to FIG. 7A, for area 710 on the substrate 700, since all components, also referred to as dies, were fabricated right next to each other, it would be expected that system performance for systems (e.g., boards) incorporating the components from this area would be similar. Based on the component data, similarities and differences between the performance characteristics of the components are known. Given the system test data 725 for the boards incorporating the power supplies, an outlier in the system test data 725 can be determined and correlated to a particular component.

In FIG. 7B, system test data (i.e., a power value of 10) for component a1 is shown in the corresponding location for component a1. Accordingly, the system test data for the systems incorporating the components in area 710 is illustrated. Outlier detection can be utilized to identify the system test for the system incorporating component a3 as an outlier (i.e., a power value of 4) in comparison with values of 9-12 for other systems incorporating other components from area 710 on the substrate 700. Table 7 shows an example of test system data.

Although a right, lower portion of the substrate is illustrated in FIG. 7B, other areas, including the wafer edge, the wafer center, and the like can be utilized to define the area of the substrate.

Although a single set of system test data is illustrated in FIG. 7B, one of ordinary skill in the art will appreciate that other system test data can be utilized without departing from the scope of the present disclosure.

TABLE 7

| Board ID | Test1 Power | Test2 Voltage | N of retests | Test4 Spectrum | Test5 Leakage |
|----------|-------------|---------------|--------------|----------------|---------------|
| 1        | 10          | 6             | 1            | 7              | 7             |
| 2        | 11          | 1             | 0            | 3              | 4             |
| 3        | 4           | 6             | 1            | 4              | 5             |
| 4        | 9           | 2             | 6            | 6              | 5             |
| 5        | 5           | 7             | 5            | 5              | 5             |
| 6        | 12          | 3             | 1            | 5              | 6             |
| 7        | 11          | 2             | 0            | 6              | 5             |
| 8        | 12          | 2             | 6            | 2              | 4             |
| 9        | 10          | 2             | 5            | 7              | 5             |
| 10       | 9           | 3             | 0            | 8              | 7             |
| 11       | 6           | 6             | 5            | 4              | 3             |
| 12       | 6           | 7             | 6            | 5              | 2             |
| 13       | 4           | 6             | 5            | 3              | 6             |
| 14       | 5           | 6             | 0            | 4              | 7             |
| 15       | 3           | 5             | 0            | 7              | 4             |
| 16       | —           | —             | —            | —              | —             |
| 17       | —           | —             | —            | —              | —             |
| 18       | —           | —             | —            | —              | —             |
| 19       | 5           | 2             | 0            | 3              | 6             |
| 20       | 6           | 3             | 0            | 6              | 8             |

Examining FIG. 7B, an outlier may be determined for component a3, which has a good low power test of 4 in comparison with a bad high power test of 9-12 for other components in area 710. For the board incorporating component a3, a problem with either the board or the component can be identified. Thus, embodiments according to the present disclosure may be able to determine a good die in a bad neighborhood (GDBN) based on system test data.

Figure 7C:
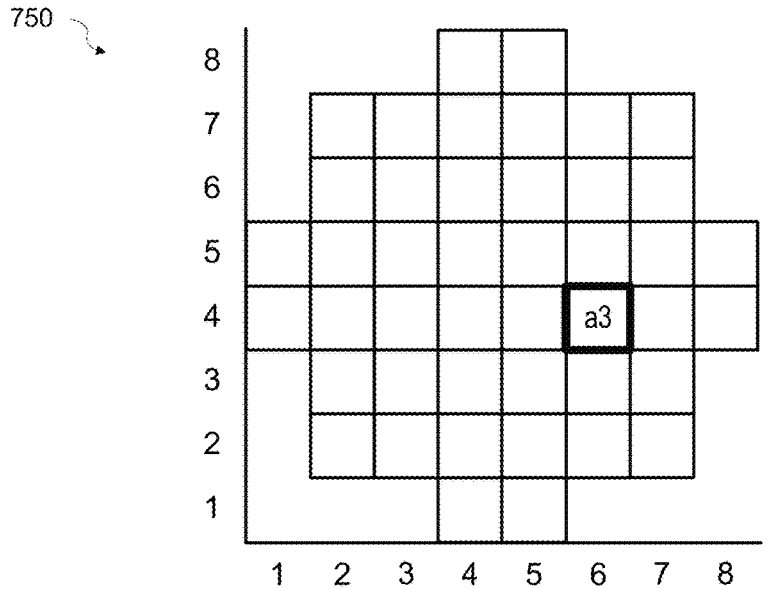
FIG. 7C is a diagram illustrating component outlier detection according to various aspects of the present disclosure. Component a3 has been determined as an outlier component based on the system test data illustrated in FIG. 7B.

FIG. 7C is a diagram illustrating component outlier detection 750 according to various of the present disclosure. Referring to FIG. 7C, component a3 has been determined as an outlier component based on the system test data illustrated in FIG. 7B. Table 8 shows the outlier test data for component (PSU) a3.

TABLE 8

| PSU | Board ID | Test1 Power |
|-----|----------|-------------|
| a3  | 3        | 4           |

Figure 8A:
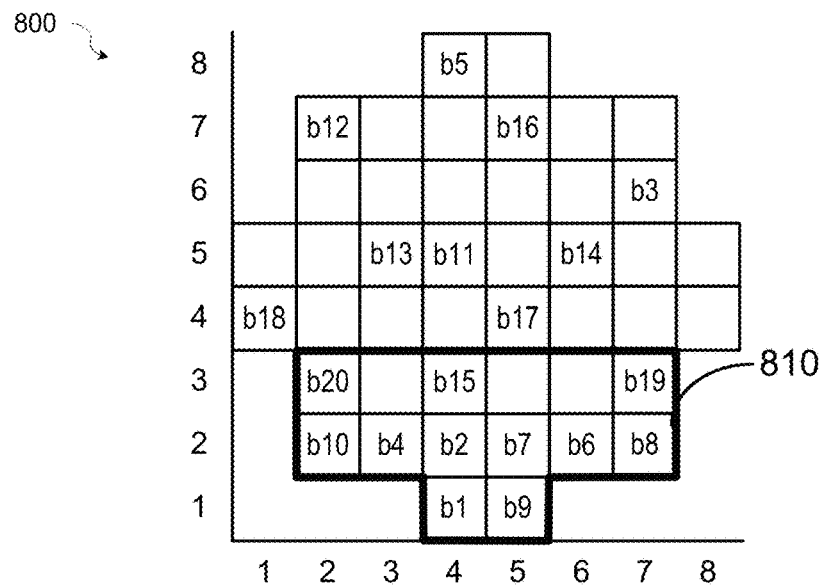
FIG. 8A is a diagram illustrating a substrate with labeled components according to various aspects of the present disclosure.

FIG. 8A is a diagram illustrating a substrate 800 with labeled components according to various aspects of the present disclosure. Table 9 shows a list of components based on X and Y coordinates.

TABLE 9

| CPU | X | Y |
|-----|---|---|
| b1  | 4 | 1 |
| b2  | 4 | 2 |
| b3  | 7 | 6 |
| b4  | 3 | 2 |
| b5  | 4 | 8 |
| b6  | 6 | 2 |
| b7  | 5 | 2 |
| b8  | 7 | 2 |

TABLE 9-continued

| CPU | X | Y |
|-----|---|---|
| b9  | 5 | 1 |
| b10 | 2 | 2 |
| b11 | 4 | 5 |
| b12 | 2 | 7 |
| b13 | 3 | 5 |
| b14 | 6 | 5 |
| b15 | 4 | 3 |
| b16 | 5 | 7 |
| b17 | 5 | 4 |
| b18 | 1 | 4 |
| b19 | 7 | 3 |
| b20 | 2 | 3 |

A relationship may be established between a set of electronic components and the electronic systems as shown in Table 10.

TABLE 10

| Board ID | CPU |
|----------|-----|
| 1  | b1  |
| 2  | b2  |
| 3  | b3  |
| 4  | b4  |
| 5  | b5  |
| 6  | b6  |
| 7  | b7  |
| 8  | b8  |
| 9  | b9  |
| 10 | b10 |
| 11 | b11 |
| 12 | b12 |
| 13 | b13 |
| 14 | b14 |
| 15 | b15 |
| 16 | b16 |
| 17 | b17 |
| 18 | b18 |
| 19 | b19 |
| 20 | b20 |

In FIG. 8A, substrate 800 (also referred to as a wafer) is illustrated, with components and their spatial position on the substrate identified by component identifiers b1 through b20. As illustrated in FIG. 8A, components that are distributed across the substrate have been identified. As an example, components b1-b20 can be CPUs. Data on the performance characteristics of each of the components is provided by the component manufacturer, test company, or the like.

Figure 8B:
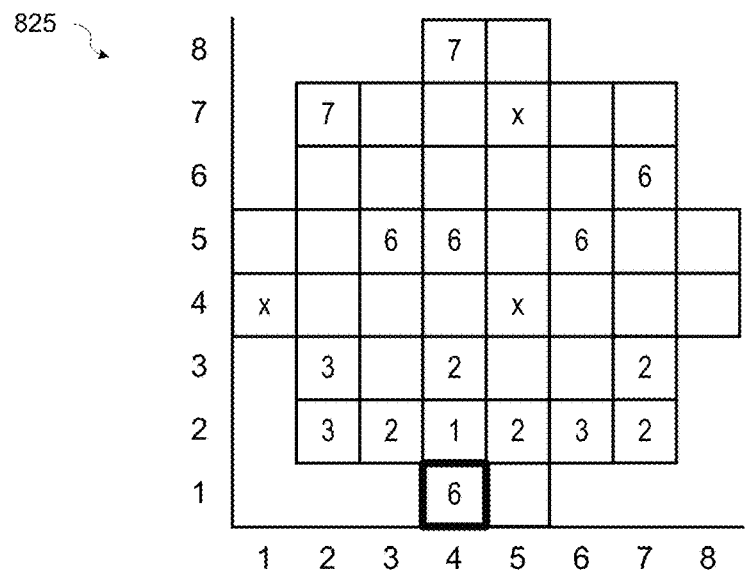
FIG. 8B is a diagram illustrating system test results for systems incorporating components from an area of the substrate according to various aspects of the present disclosure.

FIG. 8B is a diagram illustrating system test results 825 for systems incorporating components from an area 810 of the substrate according to various aspects of the present disclosure. A subgroup of the set is defined to provide a list of components (e.g., CPUs) from the bottom portion of the substrate based on substrate position as shown in Table 11.

TABLE 11

| X | Y | CPU |
|---|---|-----|
| 4 | 1 | b1  |
| 4 | 2 | b2  |
| 3 | 2 | b4  |
| 6 | 2 | b6  |
| 5 | 2 | b7  |
| 7 | 2 | b8  |
| 5 | 1 | b9  |
| 2 | 2 | b10 |
| 4 | 3 | b15 |

TABLE 11-continued

| X | Y | CPU |
|---|---|-----|
| 7 | 3 | b19 |
| 2 | 3 | b20 |

A data subset (subgroup of set of components and corresponding board test data—Voltage) can also be defined as shown in Table 12.

TABLE 12

| CPU | Board ID | Test2 Voltage |
|-----|----------|---------------|
| b1  | 1  | 6 |
| b2  | 2  | 1 |
| b4  | 4  | 2 |
| b6  | 6  | 3 |
| b7  | 7  | 2 |
| b8  | 8  | 2 |
| b9  | 9  | 2 |
| b10 | 10 | 3 |
| b15 | 15 | 5 |
| b19 | 19 | 2 |
| b20 | 20 | 3 |

As illustrated in FIG. 8B, system test data is shown correlated with the location of the component incorporated into each system that is tested. For example, system test data (voltage value of 7) for component b5 is shown in the location for component b5. Reviewing the data illustrated in FIG. 8B, a distinction between devices on the top portion of the substrate, having performance data with values of 6 and 7 and devices on the bottom portion of the substrate, having performance data with values of 1, 2, and 3, can be drawn.

Although devices on the bottom portion of the substrate generally fall into a group having performance data in the range of 1-3, the system incorporating component b1 is an outlier, with performance data having a value of 6, which is more typically found for devices incorporating components from the top portion of the substrate. Thus, outlier detection can be utilized to identify the system test for the system incorporating component b1 as an outlier (value of 6 in comparison with values of 1-3 for other systems incorporating other components from the bottom portion of the substrate. In FIG. 8B, regions of the substrate marked with X indicate that no test data for a system with this component is available. However, the location information may be used in order to identify other systems from affected area of the substrate. For example, if it is determined that whole top of the substrate is bad, the system manufacturer may be notified to hold systems incorporating components from this region of the substrate, even though these systems may have not been tested.

Although a single set of system test data is illustrated in FIG. 8B, other system test data can be utilized. Table 13 shows an example of test system data corresponding to the board IDs.

TABLE 13

| Board ID | Test1 Power | Test2 Voltage | N of retests | Test4 Spectrum | Test5 Leakage |
|----------|-------------|---------------|--------------|----------------|---------------|
| 1 | 10 | 6 | 1 | 7 | 7 |
| 2 | 11 | 1 | 0 | 3 | 4 |
| 3 | 4  | 6 | 1 | 4 | 5 |
| 4 | 9  | 2 | 6 | 6 | 5 |
| 5 | 5  | 7 | 5 | 5 | 5 |

TABLE 13-continued

| Board ID | Test1 Power | Test2 Voltage | N of retests | Test4 Spectrum | Test5 Leakage |
|---|---|---|---|---|---|
| 6 | 12 | 3 | 1 | 5 | 6 |
| 7 | 11 | 2 | 0 | 6 | 5 |
| 8 | 12 | 2 | 6 | 2 | 4 |
| 9 | 10 | 2 | 5 | 7 | 5 |
| 10 | 9 | 3 | 0 | 8 | 7 |
| 11 | 6 | 6 | 5 | 4 | 3 |
| 12 | 6 | 7 | 6 | 5 | 2 |
| 13 | 4 | 6 | 5 | 3 | 6 |
| 14 | 5 | 6 | 0 | 4 | 7 |
| 15 | 3 | 5 | 0 | 7 | 4 |
| 16 | — | — | — | — | — |
| 17 | — | — | — | — | — |
| 18 | — | — | — | — | — |
| 19 | 5 | 2 | 0 | 3 | 6 |
| 20 | 6 | 3 | 0 | 6 | 8 |

Figure 8C:
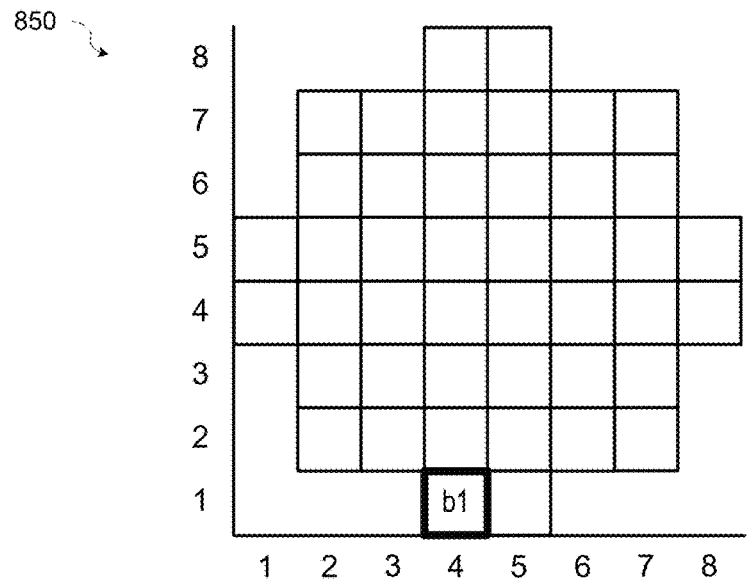
FIG. 8C is a diagram illustrating component outlier detection according to various aspects of the present disclosure.

FIG. 8C is a diagram illustrating component outlier detection 850 according to various aspects of the present disclosure. Component b1 has been determined as an outlier component based on the system test data illustrated in FIG. 8B.

Although the analysis illustrated in FIGS. 8A-8C focus on upper/lower portions of a substrate, embodiments according to the present disclosure are not limited to this categorization and other manners of categorizing components from a substrate can be utilized as will be understood by those of ordinary skill in the art. Although one system test measurement is illustrated, embodiments according to the present disclosure are not limited to a single system test and combinations of system tests can be utilized. As an example, if three system tests ($T_1$, $T_2$, and $T_3$) are performed for the system, each of the three tests could be analyzed separately and combinations could be analyzed, including combinations defined by $aT_1+bT_2+cT_3$, where a, b, and c are weights ranging from zero to one. Nonlinear fitting and other approaches to compare combinations can be utilized. Moreover, other sets of components can be compared in all possible permutations. One of ordinary skill in the art would recognize many variations, modifications, and alternatives.

It should be noted that the analytics system (e.g., the analytics system 210) can learn over time. For example, if power supplies are being analyzed, the power consumption of the system may be determined as the most significant system test in terms of identifying a power supply as an outlier. Operating frequency of the system may be determined to have less indicative value. Accordingly, over time, the number of system tests analyzed can be pruned by analyzing the impact of the test of the outlier determination process.

Although a single component is illustrated in FIG. 8A, it will be appreciated that a similar analysis could be performed for multiple sets of components (e.g., combining a1-a20 and b1-b20) that are integrated in a particular system. Thus, the example illustrated here is provided merely by way of example and is not intended to limit the use of the present embodiments in analyzing multiple sets of components integrated into a system. One of ordinary skill in the art would recognize many variations, modifications, and alternatives.

Figure 9A:
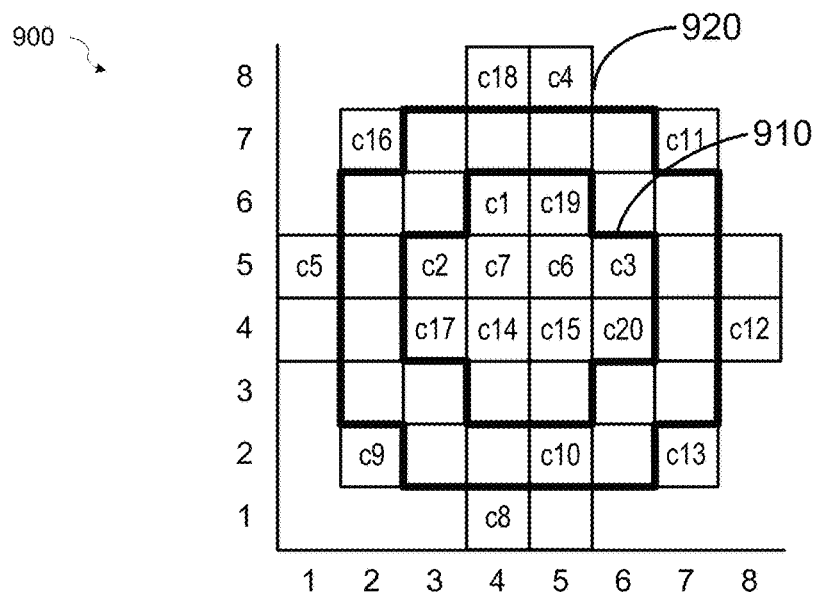
FIG. 9A is a diagram illustrating a substrate with labeled components according to various aspects of the present disclosure.

FIG. 9A is a diagram illustrating a substrate 900 with labeled components according to various aspects of the present disclosure. Table 14 shows a list of components based on X and Y coordinates.

TABLE 14

| Memory | X | Y |
|---|---|---|
| c1 | 4 | 6 |
| c2 | 3 | 5 |
| c3 | 6 | 5 |
| c4 | 5 | 8 |
| c5 | 1 | 5 |
| c6 | 5 | 5 |
| c7 | 4 | 5 |
| c8 | 4 | 1 |
| c9 | 2 | 2 |
| c10 | 5 | 2 |
| c11 | 7 | 7 |
| c12 | 8 | 4 |
| c13 | 7 | 2 |
| c14 | 4 | 4 |
| c15 | 5 | 4 |
| c16 | 2 | 7 |
| c17 | 3 | 4 |
| c18 | 4 | 8 |
| c19 | 5 | 6 |
| c20 | 6 | 4 |

A relationship may be established between a set of electronic components and the electronic systems as shown in Table 15.

TABLE 15

| Board ID | Memory |
|---|---|
| 1 | c1 |
| 2 | c2 |
| 3 | c3 |
| 4 | c4 |
| 5 | c5 |
| 6 | c6 |
| 7 | c7 |
| 8 | c8 |
| 9 | c9 |
| 10 | c10 |
| 11 | c11 |
| 12 | c12 |
| 13 | c13 |
| 14 | c14 |
| 15 | c15 |
| 16 | c16 |
| 17 | c17 |
| 18 | c18 |
| 19 | c19 |
| 20 | c20 |

In FIG. 9A, the substrate 900 (also referred to as a wafer) is illustrated, with components and their spatial position on the substrate identified by component identifiers c1 through c20. As illustrated in FIG. 9A, sets of components that are a subset of the total number of components can be identified by separate areas. Central area 910 includes components c1, c2, c3, c6, c7, c14, c15, c17, c19, and c20 is highlighted. Other components are included in peripheral area 920. As an example, components c1-c20 can be memories. In some embodiments, data on the performance characteristics of each of the components is provided by the component manufacturer, test company, or the like. In other embodiments, system test data is provided and utilized.

A first subgroup of the set—list of components (Memories) from substrate peripheral area 920 are defined based on substrate position as shown in Table 16.

TABLE 16

| X | Y | Memory |
|---|---|--------|
| 4 | 1 | c4 |
| 4 | 2 | c5 |
| 3 | 2 | c8 |
| 6 | 2 | c9 |
| 5 | 2 | c11 |
| 7 | 2 | c12 |
| 5 | 1 | c13 |

A second subgroup of the set—list of components (Memories) from substrate central area 910 are also defined based on position as shown in Table 17.

TABLE 17

| X | Y | Memory |
|---|---|--------|
| 4 | 1 | c1 |
| 4 | 2 | c2 |
| 3 | 2 | c3 |
| 6 | 2 | c6 |
| 5 | 2 | c7 |
| 7 | 2 | c14 |
| 5 | 1 | c15 |
| 4 | 3 | c20 |

9B is a diagram illustrating system test results 925 for systems incorporating components from different areas of the substrate according to various aspects of the present disclosure.

A first data subset (1st subgroup of set of components and corresponding board test data—N of retests) is defined as shown in Table 18.

TABLE 18

| Memory | Board ID | N of retests |
|--------|----------|--------------|
| c4 | 4 | 6 |
| c5 | 5 | 5 |
| c8 | 8 | 6 |
| c9 | 9 | 5 |
| c11 | 11 | 5 |
| c12 | 12 | 6 |
| c13 | 13 | 5 |

A second data subset (2nd subgroup of set of components and corresponding board test data—N of retests, i.e., a number of test attempts until passing test data was obtained) is defined as shown in Table 19.

TABLE 19

| Memory | Board ID | N of retests |
|--------|----------|--------------|
| c1 | 1 | 1 |
| c2 | 2 | 0 |
| c3 | 3 | 1 |
| c6 | 6 | 1 |
| c7 | 7 | 0 |
| c14 | 14 | 0 |
| c15 | 15 | 0 |
| c20 | 20 | 0 |

Figure 9B:
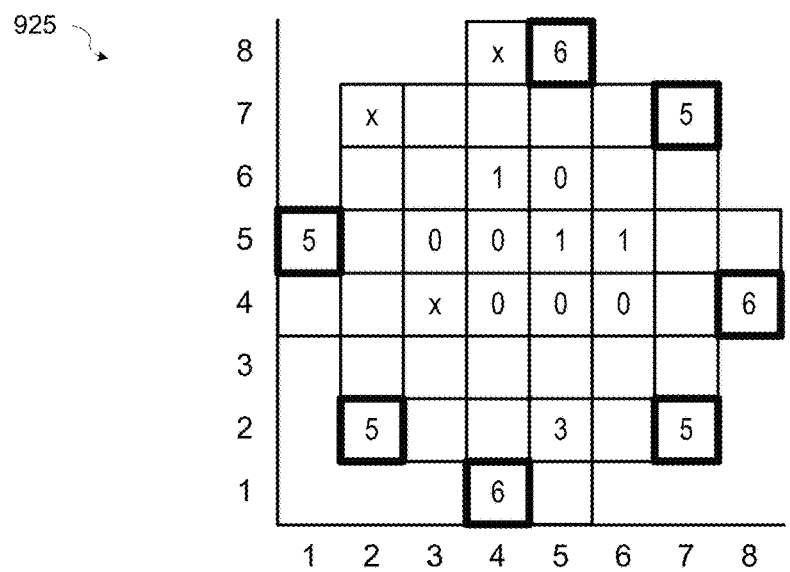
FIG. 9B is a diagram illustrating system test results for systems incorporating components from different areas of the substrate according to various aspects of the present disclosure.

As illustrated in FIG. 9B, system test data 925 is shown correlated with the location of the component incorporated into each system that is tested. Analyzing FIG. 9B, a distinction between devices near the center of the substrate 910, having performance data with values of 0 and 1 and devices near the periphery of the substrate 920, having performance data with values of 5 and 6, can be drawn. It should be noted that the system incorporating component c10 near the bottom periphery of the substrate is, to an extent, inconclusive since the performance data has a value of 3, not 5 or 6. In some embodiments, a system incorporating a component like c10 and/or the component can be excluded from the analysis.

Figure 9C:
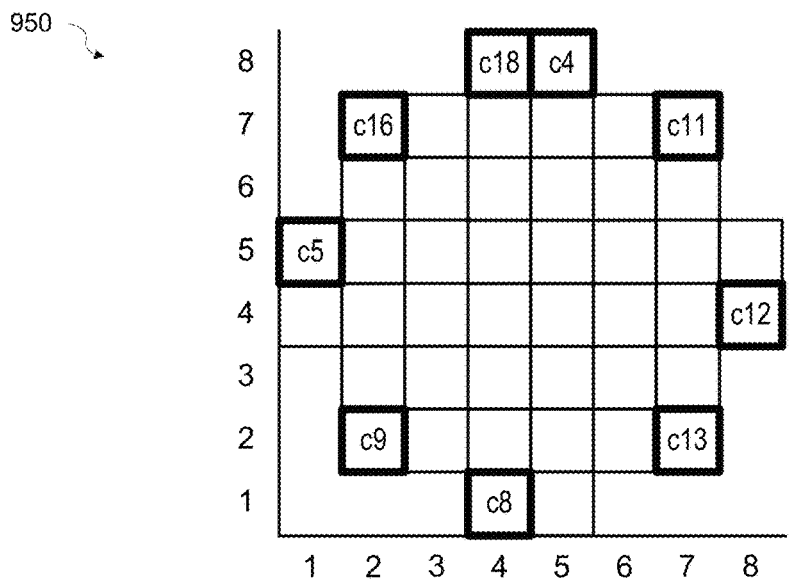
FIG. 9C is a diagram illustrating component outlier detection according to various aspects of the present disclosure.

FIG. 9C is a diagram illustrating component outlier detection 950 according to aspects of the present disclosure. Table 20 shows a number of retests required for components at the periphery of the substrate to pass test.

TABLE 20

| Memory | Board ID | N of retests |
|--------|----------|--------------|
| c4 | 4 | 6 |
| c5 | 5 | 5 |
| c8 | 8 | 6 |
| c9 | 9 | 5 |
| c11 | 11 | 5 |
| c12 | 12 | 6 |
| c13 | 13 | 5 |
| c16 | 16 | — |
| c18 | 18 | — |

The components at the periphery of the substrate are identified as being outliers compared to the components from center of the substrate based on the system test data. This identification may lead to a conclusion that all components at the periphery are affected by the same manufacturing issue. Therefore, components c16 and c18 may be identified because of their location at the periphery, even though there is no system test data associated with those components.

Although a single set of system test data is illustrated in FIG. 9B, other system test data can be utilized. Table 21 shows an example of test system data corresponding to the board IDs.

TABLE 21

| Board ID | Test1 Power | Test2 Voltage | N of retests | Test4 Spectrum | Test5 Leakage |
|----------|-------------|---------------|--------------|----------------|---------------|
| 1 | 10 | 6 | 1 | 7 | 7 |
| 2 | 11 | 1 | 0 | 3 | 4 |
| 3 | 4 | 6 | 1 | 4 | 5 |
| 4 | 9 | 2 | 6 | 6 | 5 |
| 5 | 5 | 7 | 5 | 5 | 5 |
| 6 | 12 | 3 | 1 | 5 | 6 |
| 7 | 11 | 2 | 0 | 6 | 5 |
| 8 | 12 | 2 | 6 | 2 | 4 |
| 9 | 10 | 2 | 5 | 7 | 5 |
| 10 | 9 | 3 | 0 | 8 | 7 |
| 11 | 6 | 6 | 5 | 4 | 3 |
| 12 | 6 | 7 | 6 | 5 | 2 |
| 13 | 4 | 6 | 5 | 3 | 6 |
| 14 | 5 | 6 | 0 | 4 | 7 |
| 15 | 3 | 5 | 0 | 7 | 4 |
| 16 | — | — | — | — | — |
| 17 | — | — | — | — | — |
| 18 | — | — | — | — | — |
| 19 | 5 | 2 | 0 | 3 | 6 |
| 20 | 6 | 3 | 0 | 6 | 8 |

According to various aspects or the present disclosure, embodiments may aggregate data from multiple substrates to determine underperforming or over performing components associated with a particular location on a substrate that may result from a variation in manufacturing processes during substrate production. Considering a single substrate, the variation in system tests may not be significant. However, given many substrates, statistical differences in system test results can be correlated back to the components integrated into the systems.

Figure 10A:
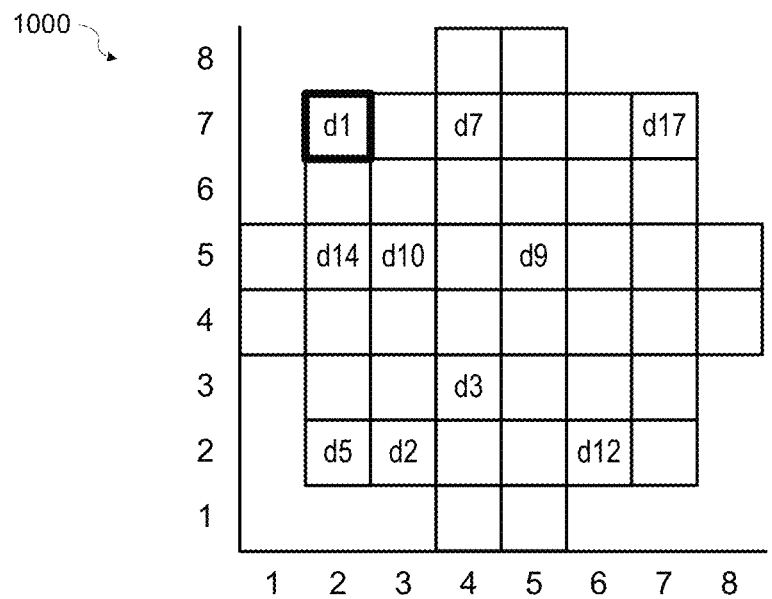
FIG. 10A is a diagram illustrating a first substrate with labeled components according to various aspects of the present disclosure.

FIG. 10A is a diagram illustrating a first substrate 1000 with labeled components according to various aspects of the present disclosure. Table 22 shows a list of components for first and second wafers based on X and Y coordinates.

TABLE 22

| Transmitter | Wafer | X | Y |
|---|---|---|---|
| d1 | 1 | 2 | 7 |
| d2 | 1 | 3 | 2 |
| d3 | 1 | 4 | 3 |
| d4 | 2 | 2 | 7 |
| d5 | 1 | 2 | 2 |
| d6 | 2 | 2 | 5 |
| d7 | 1 | 4 | 7 |
| d8 | 2 | 3 | 5 |
| d9 | 1 | 5 | 5 |
| d10 | 1 | 3 | 5 |
| d11 | 2 | 6 | 2 |
| d12 | 1 | 6 | 2 |
| d13 | 2 | 2 | 2 |
| d14 | 1 | 2 | 5 |
| d15 | 2 | 3 | 2 |
| d16 | 2 | 7 | 7 |
| d17 | 1 | 7 | 7 |
| d18 | 2 | 4 | 7 |
| d19 | 2 | 5 | 5 |
| d20 | 2 | 4 | 3 |

A relationship may be established between a set of electronic components and the electronic systems as shown in Table 23.

TABLE 23

| Board ID | Transmitter |
|---|---|
| 1 | d1 |
| 2 | d2 |
| 3 | d3 |
| 4 | d4 |
| 5 | d5 |
| 6 | d6 |
| 7 | d7 |
| 8 | d8 |
| 9 | d9 |
| 10 | d10 |
| 11 | d11 |
| 12 | d12 |
| 13 | d13 |
| 14 | d14 |
| 15 | d15 |
| 16 | d16 |
| 17 | d17 |
| 18 | d18 |
| 19 | d19 |
| 20 | d20 |

Figure 10B:
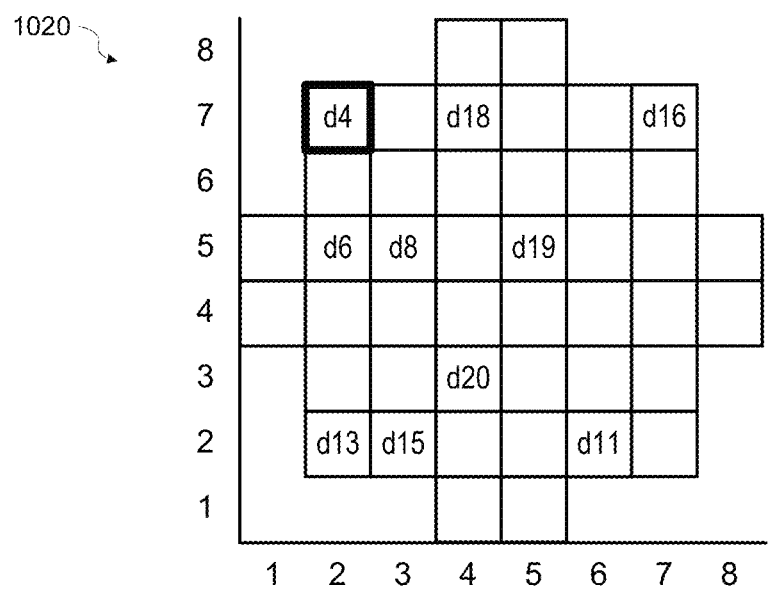
FIG. 10B is a diagram illustrating a second substrate with labeled components according to various aspects of the present disclosure.

FIG. 10B is a diagram illustrating a second substrate with labeled components according to various aspects of the present disclosure. In FIGS. 10A and 10B, first substrate 1000 and second substrate 1020 are illustrated, with components and their spatial position on the substrates identified by component identifiers d1 through d20. Comparing FIGS. 10A and 10B, components d1 (FIG. 10A) and d4 (FIG. 10B) are located at the same position on the top/left portion of the first substrate 1000 and second substrate 1020, respectively.

Data on the performance characteristics of each of the systems is provided by the system manufacturer, test company, or the like. In some embodiments, reference is made to component/system test data being received from the component/system manufacturer. However, as described below, embodiments according to the present disclosure are not limited to this arrangement. In some embodiments, the component manufacturer may not test the components, since the components may be tested by third parties, effectively outsourcing the testing function. Thus, the terms component manufacturer, system manufacturer, and the like are not intended to limit the functions that these entities can perform since different functions can be performed by one or more entities. As an example, component test data can be received from the component manufacturer, a contract test company working in conjunction with the component manufacturer, the system manufacturer, who may test components in advance of system assembly, or the like. Thus, receipt of data is not limited to the entity that manufactured the item under test and data can be received from entities other than the manufacturer.

Figures 10C, 10D, 10E:
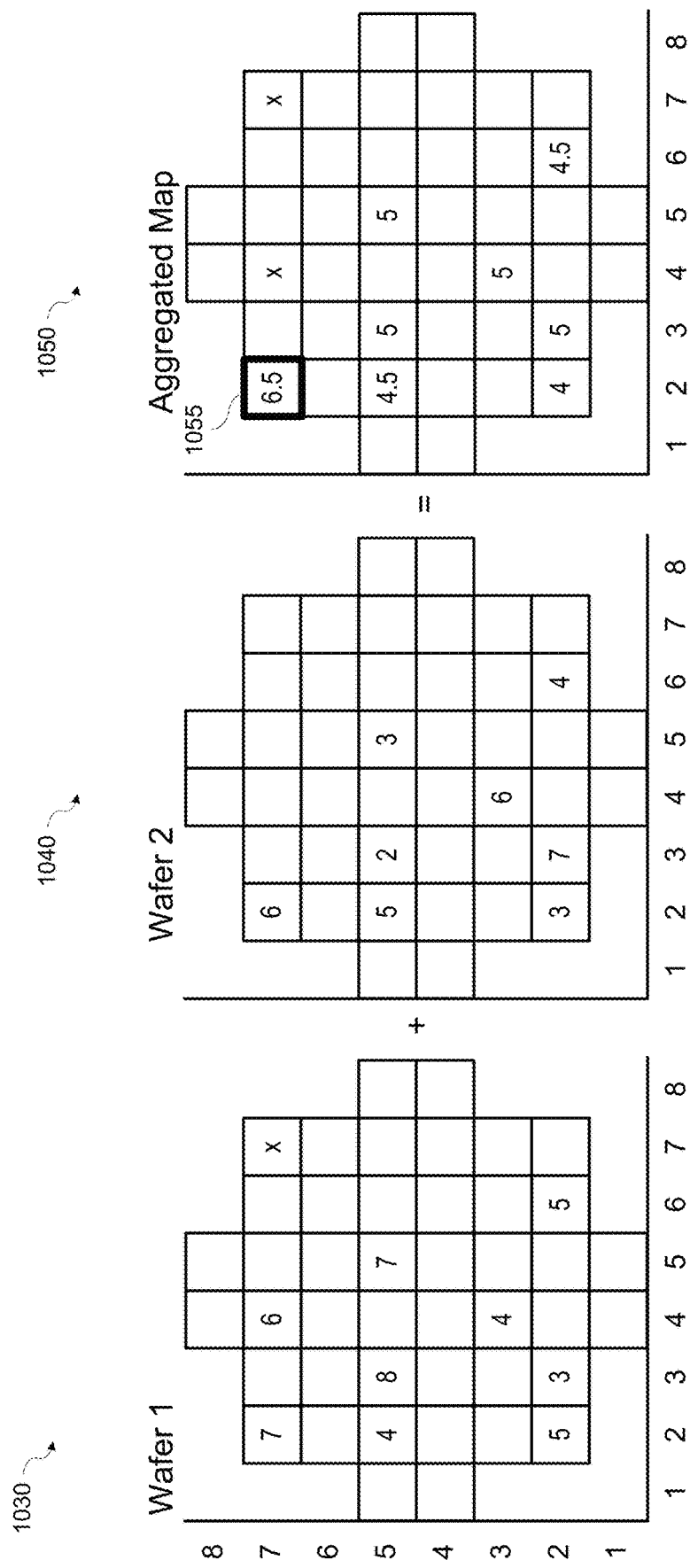
FIG. 10C is a simplified schematic diagram illustrating system test results for systems incorporating components from a first substrate according to various aspects of the present disclosure.
FIG. 10D is a diagram illustrating system test results for systems incorporating components from a second substrate according to various aspects of the present disclosure.
FIG. 10E is a diagram illustrating averaged system test results for the systems illustrated in FIGS. 10C and 10D.

FIG. 10C is a diagram illustrating system test results 1030 for systems incorporating components from a first substrate according to various aspects of the present disclosure. FIG. 10D is a diagram illustrating system test results 1040 for systems incorporating components from a second substrate according to various aspects of the present disclosure. FIG. 10E is a diagram illustrating averaged system test results 1050 for the systems illustrated in FIGS. 10C and 10D according to various aspects of the present disclosure.

Similarities in characteristics of devices can be utilized to define fabrication clusters. For example, if devices are from the same region of subsequent substrates, this can define a fabrication cluster. As an example, devices from the central portion or region of a set of substrates or from the bottom region of a set of substrates could be utilized as a fabrication cluster and could be characterized by similar properties. Referring to FIGS. 10A-10E, a subgroup of the set of electronic components can be defined as electronic components within an area defined on a substrate according to a spatial pattern and that is fewer than all of the set of electronic components on the substrate. Examples include a fabrication cluster that includes a first component associated with a location on a first substrate (e.g., d1 in FIG. 10A) and a second component associated with the location on a second substrate (e.g., d4 in FIG. 10B). The same fabrication cluster can be defined to include a first electronic component of the plurality of electronic components that spatially adjacent a second electronic component of the plurality of electronic components on a substrate (d14 and d10 in FIG. 10A). Additionally, the fabrication clusters can be defined to include a first electronic component of the plurality of electronic components that is spatially positioned on a first region of a substrate and a second electronic component of the plurality of electronic components spatially positioned on a second region of the substrate opposite the first region, for example, d1 and d5 in FIG. 10A, which are positioned at the top and bottom of the substrate, respectively. Left and right portions of the substrate could also provide spatial regions to define fabrication clusters. Therefore, according to embodiments of the present invention, fabrication clusters can be defined in various manners as appropriate to the particular application. A first fabrication cluster could be defined by a first spatial region (e.g., components near a top portion of a substrate) and a second fabrication cluster could be defined by a second spatial region (e.g., components near a bottom portion of a substrate). In some embodiments, the first spatial region and the second spatial region do not overlap. Additionally, in other embodiments, components from different spatial regions can form a fabrication cluster.

One of ordinary skill in the art would recognize many variations, modifications, and alternatives.

As described herein, a data subset can be selected from the system test data for analysis. This data subset can correspond to a subgroup of the set of electronic components present in the system. In some embodiments, the subgroup of components are the components in a fabrication cluster, which can also be referred to as a same fabrication cluster. In other embodiments, the subgroup can be a set of components fewer than the components in the fabrication cluster, i.e., the subgroup is a subset of the components in the fabrication cluster. Since all the components in a fabrication cluster are typically characterized by common characteristics, embodiments of the present invention enable outlier detection. In yet other embodiments, the subgroup can be a set of components greater than the components in the fabrication cluster, i.e., the subgroup can include components from different fabrication clusters. is a subset of the components in the fabrication cluster. In some implementations, the data subset is associated with passing data, that is, for systems that pass appropriate system tests. One of ordinary skill in the art would recognize many variations, modifications, and alternatives.

As illustrated in FIG. 10A, a fabrication cluster can include a first electronic component of the plurality of electronic components and a second electronic component of the plurality of electronic components that are spatially positioned on a peripheral region of a substrate, for example, d1, d17, and d5 in FIG. 10A and d4, d16, and d13 in FIG. 10B. Moreover, a fabrication cluster can be defined to include a first electronic component of the plurality of electronic components and a second electronic component of the plurality of electronic components that are spatially positioned in a central region of a substrate, for example, d9 and d19 in FIGS. 10A and 10B.

As illustrated in FIGS. 10C-10E, although the system test data for the systems incorporating components from the two substrates can vary from substrate to substrate, averaging, or other statistical measures, of the system test data from multiple substrates results in averaged values that fall into the range of 4-5 with the exception of the average for systems incorporating components from the position 1055 associated with components d1 and d4, which has an average value of 6.5. Accordingly, the aggregated (e.g., averaged) system test data for the systems incorporating the components from location 1055 indicates that location 1055 is an outlier compared to other locations on the substrate.

Figure 10F:
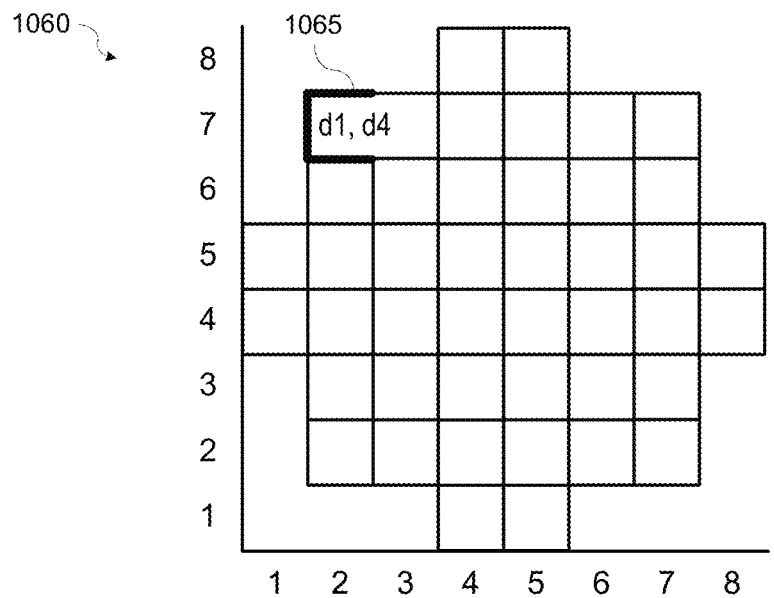
FIG. 10F is a diagram illustrating component outlier detection according to various aspects of the present disclosure.

FIG. 10F is a diagram illustrating component outlier detection 1060 according to various aspects of the present disclosure. The location 1065 associated with components d1 and d4 has been determined as an outlier location for the set of substrates based on the aggregated system test data illustrated in FIG. 10E.

Although a single set of system test data is illustrated in FIGS. 10C and 10D, other system test data can be utilized. Table 24 shows an example of test system data corresponding to the board IDs.

TABLE 24

| Board ID | Test1 Power | Test2 Voltage | N of retests | Test4 Spectrum | Test5 Leakage |
|---|---|---|---|---|---|
| 1 | 10 | 6 | 1 | 7 | 7 |
| 2 | 11 | 1 | 0 | 3 | 4 |
| 3 | 4 | 6 | 1 | 4 | 5 |
| 4 | 9 | 2 | 6 | 6 | 5 |

TABLE 24-continued

| Board ID | Test1 Power | Test2 Voltage | N of retests | Test4 Spectrum | Test5 Leakage |
|---|---|---|---|---|---|
| 5 | 5 | 7 | 5 | 5 | 5 |
| 6 | 12 | 3 | 1 | 5 | 6 |
| 7 | 11 | 2 | 0 | 6 | 5 |
| 8 | 12 | 2 | 6 | 2 | 4 |
| 9 | 10 | 2 | 5 | 7 | 5 |
| 10 | 9 | 3 | 0 | 8 | 7 |
| 11 | 6 | 6 | 5 | 4 | 3 |
| 12 | 6 | 7 | 6 | 5 | 2 |
| 13 | 4 | 6 | 5 | 3 | 6 |
| 14 | 5 | 6 | 0 | 4 | 7 |
| 15 | 3 | 5 | 0 | 7 | 4 |
| 16 | — | — | — | — | — |
| 17 | — | — | — | — | — |
| 18 | — | — | — | — | — |
| 19 | 5 | 2 | 0 | 3 | 6 |
| 20 | 6 | 3 | 0 | 6 | 8 |

Additional description related to device pairing is provided in U.S. patent application Ser. No. 15/243,661, filed on Aug. 22, 2016, the disclosure of which is hereby incorporated by reference in its entirety for all purposes It should be noted that the methods illustrated in relation to FIGS. 7-10 may be combined in a cumulative manner in order to aggregate data from multiple substrates. In these embodiments, outliers based on spatial data may be compared across multiple wafers to provide the benefits provided by aggregation, including, but not limited to, statistical averaging. As an example, the method discussed in relation to FIGS. 9A-C in which components from the center and periphery of the substrate are analyzed, could be applied over a number of substrates using the method discussed in relation to FIGS. 10A-E. Thus, aggregation over a number (e.g., hundreds) of substrates may be utilized in conjunction with the other methods discussed herein in order to provide the benefits available through aggregation. One of ordinary skill in the art would recognize many variations, modifications, and alternatives.

Figure 11:
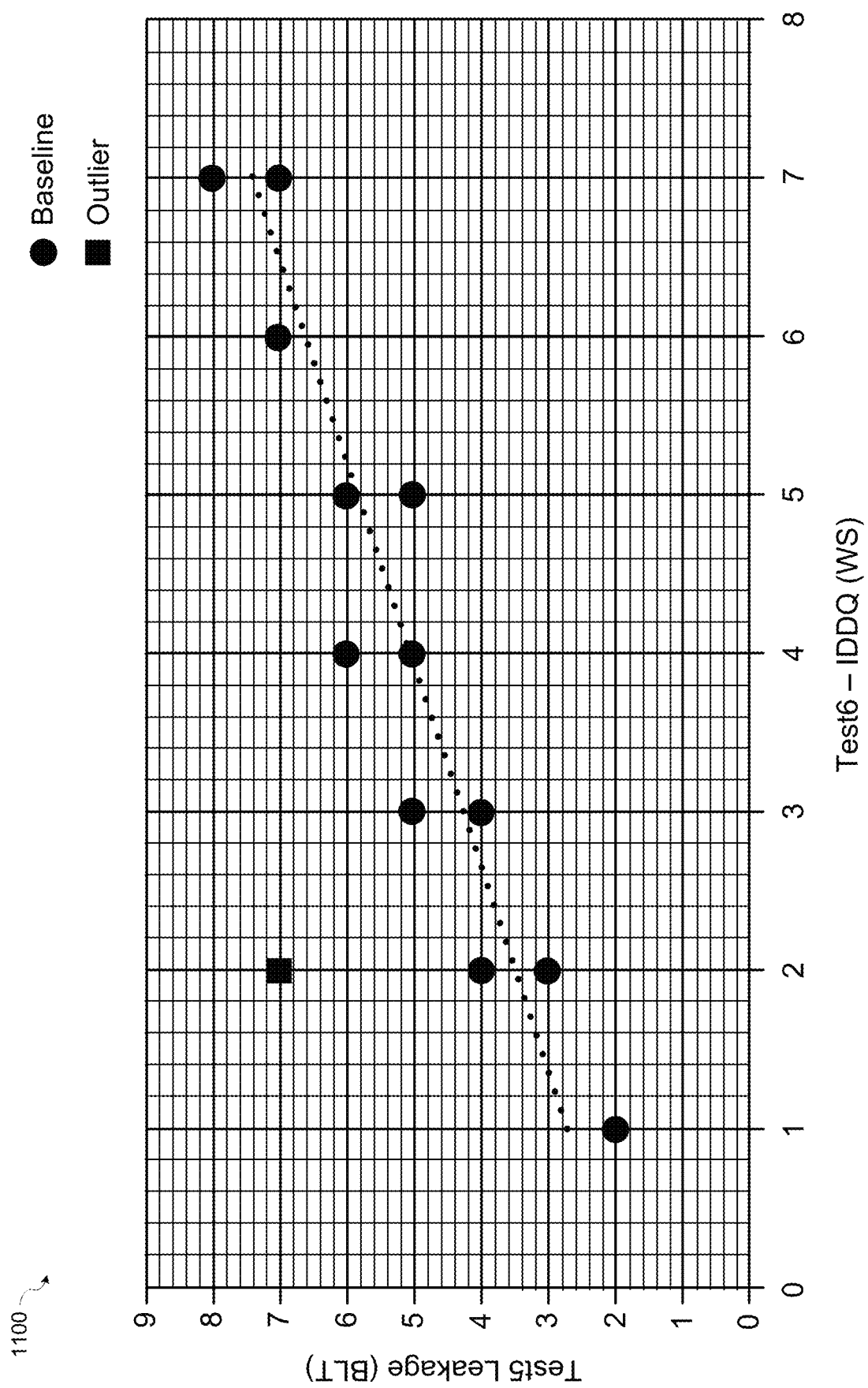
FIG. 11 is a plot illustrating system test results as a function of component test results according to various aspects of the present disclosure.

FIG. 11 is a plot illustrating system test results 1100 as a function of component test results according to various aspects of the present disclosure. As illustrated in FIG. 11, a system test, for example, current leakage measured as a board level test (BLT) is plotted versus a component test, for example, supply current (Idd) in the quiescent state—(IDDQ). The test data is shown in Table 25.

TABLE 25

| GPU | Test6 IDDQ |
|---|---|
| e1 | 7 |
| e2 | 3 |
| e3 | 3 |
| e4 | 5 |
| e5 | 3 |
| e6 | 5 |
| e7 | 4 |
| e8 | 3 |
| e9 | 5 |
| e10 | 7 |
| e11 | 2 |
| e12 | 1 |
| e13 | 5 |
| e14 | 6 |
| e15 | 2 |
| e16 | 3 |
| e17 | 4 |
| e18 | 5 |

TABLE 25-continued

| GPU | Test6 IDDQ |
|---|---|
| e19 | 4 |
| e20 | 7 |

The system test is associated with a particular system and the component tests are associated with a particular component that is incorporating into the particular system. Using this data, a relationship between a given system test result and a corresponding component test result for the component incorporated into a given system can be determined. Outliers defined in terms of this relationship can then be determined.

A relationship may be established between a set of electronic components and the electronic systems as shown in Table 26.

TABLE 26

| Board ID | GPU |
|---|---|
| 1 | e1 |
| 2 | e2 |
| 3 | e3 |
| 4 | e4 |
| 5 | e5 |
| 6 | e6 |
| 7 | e7 |
| 8 | e8 |
| 9 | e9 |
| 10 | e10 |
| 11 | e11 |
| 12 | e12 |
| 13 | e13 |
| 14 | e14 |
| 15 | e15 |
| 16 | e16 |
| 17 | e17 |
| 18 | e18 |
| 19 | e19 |
| 20 | e20 |

A subset comprising a relationship between system data (Test5) and component data (Test6) as shown in Table 27 may be defined, which is plotted in FIG. 11.

TABLE 27

| Board ID | GPU | Test6 IDDQ | Test5 Leakage |
|---|---|---|---|
| 1 | e1 | 7 | 7 |
| 2 | e2 | 3 | 4 |
| 3 | e3 | 3 | 5 |
| 4 | e4 | 5 | 5 |
| 5 | e5 | 3 | 5 |
| 6 | e6 | 5 | 6 |
| 7 | e7 | 4 | 5 |
| 8 | e8 | 2 | 7 |
| 9 | e9 | 5 | 5 |
| 10 | e10 | 7 | 7 |
| 11 | e11 | 2 | 3 |
| 12 | e12 | 1 | 2 |
| 13 | e13 | 5 | 6 |
| 14 | e14 | 6 | 7 |
| 15 | e15 | 2 | 4 |
| 16 | e16 | 3 | |
| 17 | e17 | 4 | |
| 18 | e18 | 5 | |
| 19 | e19 | 4 | 6 |
| 20 | e20 | 7 | 8 |

Referring to FIG. 11, it is illustrated that components that have component test results on the low end of the range (within specification) will result in system tests on the low end of the range when these components are integrated into a system. Similarly, systems incorporating high performing components are characterized by higher performance at the system level. Thus, in this example, the correlation is positive. In other embodiments, the correlation may be negative or have a non-linear relationship without departing from the scope of the present disclosure.

Given the relationship illustrated in FIG. 11, one system, although it includes a component showing lower performance, has system performance that is higher than the performance predicted by the determined relationship. In the particular example illustrated in FIG. 11, the following data is provided, representing an outlier from the correlation between system test results and component test results.

TABLE 28

| Board ID | GPU | Test6 IDDQ | Test5 Leakage |
|---|---|---|---|
| 8 | e8 | 2 | 7 |

It will be appreciated that although a single system test and a single component test are illustrated in FIG. 11, this example is merely to illustrate the concept and additional system tests and/or multiple component tests can be utilized according to various aspects of the present disclosure as illustrated by the test data in Table 29. Thus, multivariate implementations may be provided by embodiments of the present disclosure in which multiple system tests and multiple component tests are utilized to define the relationship between system performance and component performance.

TABLE 29

| Board ID | Test1 Power | Test2 Voltage | N of retests | Test4 Spectrum | Test5 Leakage |
|---|---|---|---|---|---|
| 1 | 10 | 6 | 1 | 7 | 7 |
| 2 | 11 | 1 | 0 | 3 | 4 |
| 3 | 4 | 6 | 1 | 4 | 5 |
| 4 | 9 | 2 | 6 | 6 | 5 |
| 5 | 5 | 7 | 5 | 5 | 5 |
| 6 | 12 | 3 | 1 | 5 | 6 |
| 7 | 11 | 2 | 0 | 6 | 5 |
| 8 | 12 | 2 | 6 | 2 | 4 |
| 9 | 10 | 2 | 5 | 7 | 5 |
| 10 | 9 | 3 | 0 | 8 | 7 |
| 11 | 6 | 6 | 5 | 4 | 3 |
| 12 | 6 | 7 | 6 | 5 | 2 |
| 13 | 4 | 6 | 5 | 3 | 6 |
| 14 | 5 | 6 | 0 | 4 | 7 |
| 15 | 3 | 5 | 0 | 7 | 4 |
| 16 | — | — | — | — | — |
| 17 | — | — | — | — | — |
| 18 | — | — | — | — | — |
| 19 | 5 | 2 | 0 | 3 | 6 |
| 20 | 6 | 3 | 0 | 6 | 8 |

In relation to the methods discussed herein, the following should be appreciated. System test data can be for system failure data. The test data can contain results of at least one test that failed the test limits. Bin data for failing bins may also be considered a failure data. The system test data can be system performance data. The test data can include results of one or more tests which did not fail the test limits. Bin data for passing bins may be considered a performance data. The test data may include data collected on another system or component tested in parallel or closely before or after the current system or component and attributed to the current system or component. The test data may also include data obtained by comparing data for current system or component to data collected on another system or component tested in parallel or closely before or after the current system or component, e.g. how much longer the current system or component took to test, how much faster is the current component or systems.

The system test/component test data can be numeric data. The test data may be a numeric data collected for a system or a component, i.e. numeric values outputted for the test parameters e.g., voltages, currents, frequencies, etc. measured during the test. The numerical test data may also be data related to the tests, e.g. number of test attempts before a final passing or failing value was obtained, time it took to obtain the test outcome, etc. The system test data/component test data can also be categorical data. The test data may be a categorical data collected for a system or a component, e.g., pass/fail outcomes for particular tests, soft or hard bins assigned during testing, text strings outputted for test parameters e.g. ("red"/"green"/"blue"), Boolean values (true/false), numeric test outcomes where there is no meaning to the relative value of the test result, e.g. 1 and 0 representing pass/fail, numeric error codes. The numerical test data may also be data related to the tests, e.g. number of test attempts before a final passing or failing value was obtained, time it took to obtain the test outcome, etc.

Establishing a relationship can include obtaining genealogy data for the electronic systems. Genealogy data is data linking specific electronics components to the systems upon which they are mounted. The genealogy data may be compiled by the system based on data obtained from system and component manufacturer's data information systems, e.g. from CRP, MES, shipping tracking software, etc. The genealogy data may be compiled ahead of time as relevant data becomes available, or it may be compiled in-real time while performing the outlier detection.

The fabrication batch can be a substrate or a lot and components fabricated within the same batch are expected to exhibit similar characteristics. The substrate can be one of a wafer or a glass (displays) or a roll (for roll to roll fabrication processes). The substrate can be considered as the surface on which the components from the set were fabricated or mounted during fabrication. Information about the local/global/common outlier can identify a board to which the outlier corresponds. The information may identify the board containing the component related to the identified outlier. The information may identify a single board or a batch of boards containing at least one board with the outlier component. In some cases, the information may identify another board that contain another component that may be considered an outlier based on the identified outlier component. For instance, if a hot spot is detected at certain location on a substrate, other components from the same location may also be considered outliers and information identifying at least some of the boards containing these other outlier components may be passed to the system manufacturer.

The information about the local/global/common outlier can identify a component to which the outlier corresponds. The information may identify the component related to the identified outlier. The information may identify a single component or a batch of components containing the outlier component. In some cases, the information may identify another component that may be considered an outlier based on the identified outlier component. For instance, if a hot spot is detected at certain location on a substrate, other components from the same location may also be considered outliers and information identifying at least some of these components may be passed to the component manufacturer or to the system (e.g., board) manufacturer.

In addition to the term fabrication batch, the concept of a manufacturing cluster can be utilized by embodiments of the present invention. Clustering analysis may be performed on obtained manufacturing data, clustering obtained manufacturing data into one or more "clusters" (also referred to herein as "manufacturing clusters" or "fabrication clusters"). For instance, the "cluster analysis" (or in other words "clustering") may be performed on all of the obtained manufacturing data (e.g., if only statistically manipulable was obtained) or on part of the obtained manufacturing data (e.g., if data that is not statistically manipulable is also obtained, and/or if for any reason it is not desirable to cluster some of the data that is obtained). As an example, a particular location common to multiple substrates can be detected as a manufacturing cluster by embodiments of the present invention. Additional discussion related to manufacturing clusters is provided in commonly assigned U.S. patent application Ser. No. 15/069,284, filed on Mar. 14, 2016, the disclosure of which is hereby incorporated by reference in its entirety for all purposes.

It should be noted that according to some embodiments of the present invention, clustering does not include combining different attributes together to form clusters of attributes, but rather dividing components into clusters based on their attribute data. Accordingly, embodiments of the present invention are not limited to the formation of fabrication clusters based only on spatial data (i.e., clustering in the 'spatial' realm). Rather, exemplary fabrication clusters can include, without limitation, clustering based on one or more of the following attributes: 1) spatial—adjacent on the substrate, from the same area of the substrate, or the like; 2) time—manufactured at the same time, e.g., within a short time period of time, right before or after each other, or the like; 3) equipment—manufactured using the same piece of fabrication equipment, manufactured using a specific series of a type of equipment, or the like. Thus, the examples of manufacturing attributes discussed herein are merely exemplary and can include: times of fabrication, location of fabrication, identifiers for fabrication equipment, or the like.

Identifying can be performed automatically and can include aggregating data subsets across multiple substrates. A statistical method used for outlier detection may utilize a minimum sample size to yield a statistically meaningful outcome. It may be beneficial to aggregate data from more than one subset (more than one component from the same set) to generate a set of data that meets the requirements of the selected outlier detection method. Identifying can be performed automatically and can include determining that a data subset has enough data. A statistical method used for outlier detection may utilize a minimum sample size to yield a statistically meaningful outcome. The system may evaluate if the amount of data in the data subset meets the requirements of the selected statistical method before proceeding with the outlier detection.

In the methods described herein, the various methods can be repeated for another set of components, for example, until an outlier is identified, can be repeated for another subgroup of components, for example, until an outlier is identified, or can be repeated for another data subset, for example, until an outlier is identified.

The method can include storing the information about the outlier in the system. Aggregation of the stored information can be performed to determine at least one of set of components, subgroup of components, data subset in a consecutive analysis. The determination of which set of components, subgroup of components, data subset to be used by the method may be done based on an input from an engineer or the system may be programmed to continue trying different combinations of set of components, subgroup of components, data subset until an outlier is identified or until all combinations are exhausted. Historical information about combinations that resulted in identifying an outlier may be used by the system to prioritize combinations for the future analysis. The system may use an aggregated historical data or may employ a more sophisticated machine learning techniques to optimize its outlier finding performance.

The spatial pattern ca be related to a fabrication process of the set. Engineering knowledge about the component fabrication process may be used in determining the spatial pattern to be used in outlier detection. For instance some technologies may have a known variation between the edge and center of the substrate while some technologies may have variation between the top and the bottom. Some examples of spatial patters are adjacent location, substrate edge, substrate center, substrate segments or sectors, substrate rows or columns, periodic location, i.e. odd rows, etc. Historical data about which spatial patterns resulted in outlier detection may be stored by the system and used automatically to prioritize the patterns with highest likelihood of detecting an outlier.

Figure 12:
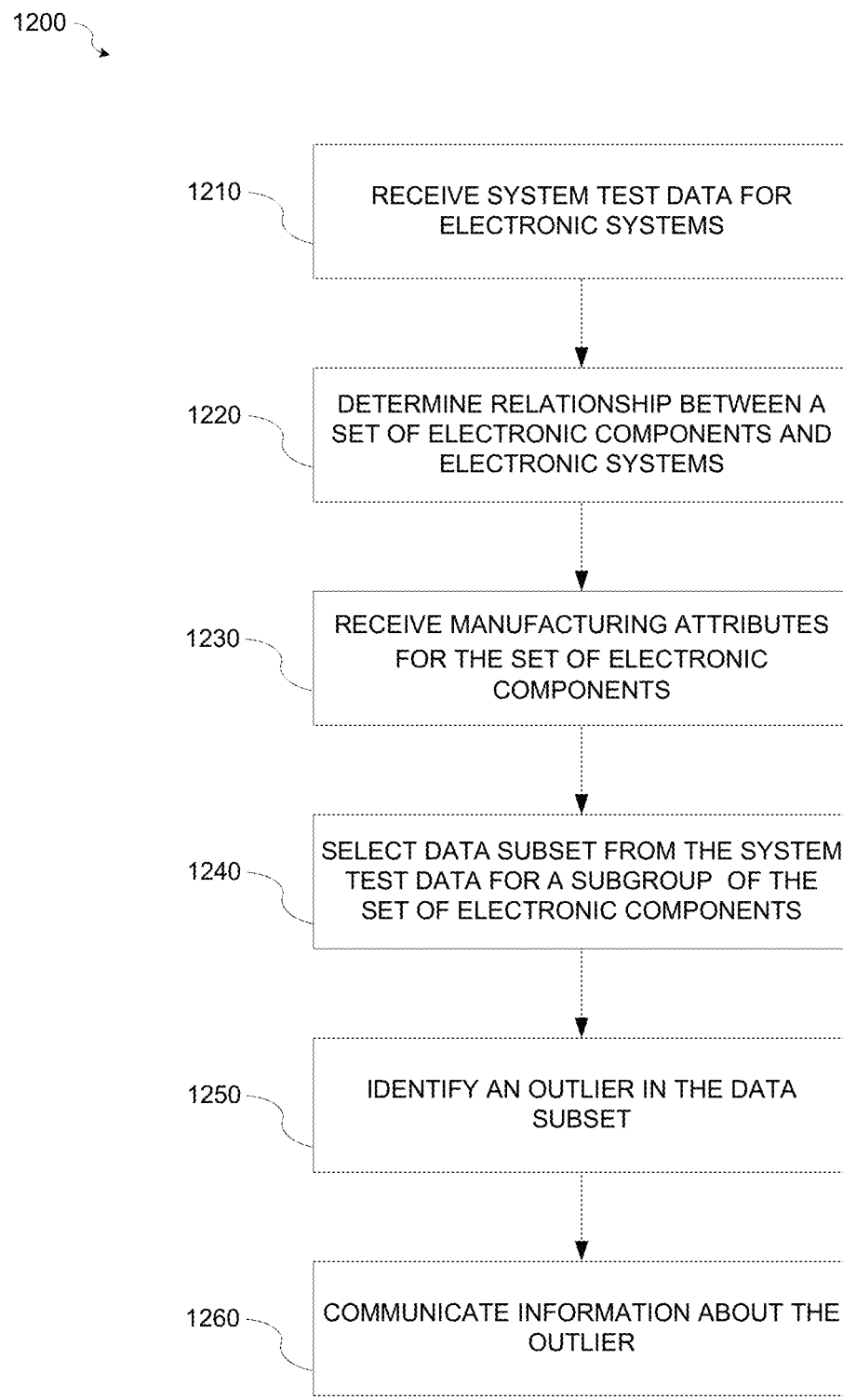
FIG. 12 is a flowchart of a method for identifying an outlier in a data subset according to various aspects of the present disclosure.

FIG. 12 is a flowchart of a method 1200 for identifying an outlier in a data subset according to various aspects of the present disclosure. Referring to FIG. 12, at block 1210, system test data for a plurality of electronic systems may be received. For example, the system test data may be received from a system manufacturer, an equipment manufacturer, a contract test company, other third parties, etc. The system test data may include system failure data, system performance data, numeric data, and/or categorical data. The system test data may or may not include component test data. The system test data may pass system specifications such that an electronic system is operable within the specifications for the particular electronic system. The electronic system may be, for example, but not limited to, an IC, a chip, a memory, a battery, a display, a transmitter, a receiver, a MCP, a MCM, a 2D IC/SiP, a circuit board, a system, a module, etc. The electronic system may include a plurality of electronic components.

At block 1220, a relationship between a set of the electronic components and the electronic systems may be determined. The set of the electronic components may be assembled on the electronic systems. The set of the electronic components may be a type of electronic component, for example, but not limited to, a power supply.

At block 1230, manufacturing attributes for the set of electronic components may be received. The manufacturing attributes may include spatial data for the set of the electronic components. The spatial data may be a location on a substrate, or multiple locations on more than one substrate. A spatial pattern may be determined through clustering of spatial data. Alternatively, the spatial pattern may be determined through clustering of manufacturing attributes. Alternatively or additionally, the manufacturing attributes may include, for example, but not limited to, a lot or batch number, a substrate identifier, substrate x-y coordinates for each of the set of electronic components, etc.

At block 1240, a data subset from the system test data corresponding to a subgroup of the set of electronic components may be selected. The correspondence may be based on an established relationship. The subgroup may include components within an area defined on a substrate according to a spatial pattern. The subgroup may be fewer than all of the set of electronic components on the substrate. The components within the area may be adjacent components. The substrate may be, for example, but not limited to a silicon wafer, a glass substrate, or other substrate.

The data subset may be associated with systems having system test data passing system specifications. The data subset may correspond to characteristics of a type of electronic component, for example, but not limited to, power output of an electronic system for a power supply component.

The system test data corresponding to the subgroup of the set of electronic components may include system test data for a system including a component, or specific test data from the system test data that may be attributed to or affected by one or more specific component, including, for example, but not limited to, system frequency or CPU frequency.

At block 1250, an outlier may be identified in the data subset. The outlier may be an outlier relative to the data subset. Alternatively or additionally, the outlier may be a local outlier or a global outlier. Identifying an outlier in the data set may include receiving data for failing systems but only analyzing system test data for non-failing systems. The outlier in the data subset may be identified automatically and/or dynamically. Automatically identifying the outlier may include aggregating categorical data. Identifying the outlier may include determining whether the data subset includes a sufficient amount of data to perform a desired analysis. In accordance with various aspects of the present disclosure, the outlier may be identified at least in part by aggregating data subsets across multiple substrates.

At block 1260, the information about the outlier may be communicated. For example, the information about the outlier may be communicated to a system manufacturer of a component manufacturer. The information about the outlier may identify a board and/or a component to which the outlier corresponds.

Figure 13:
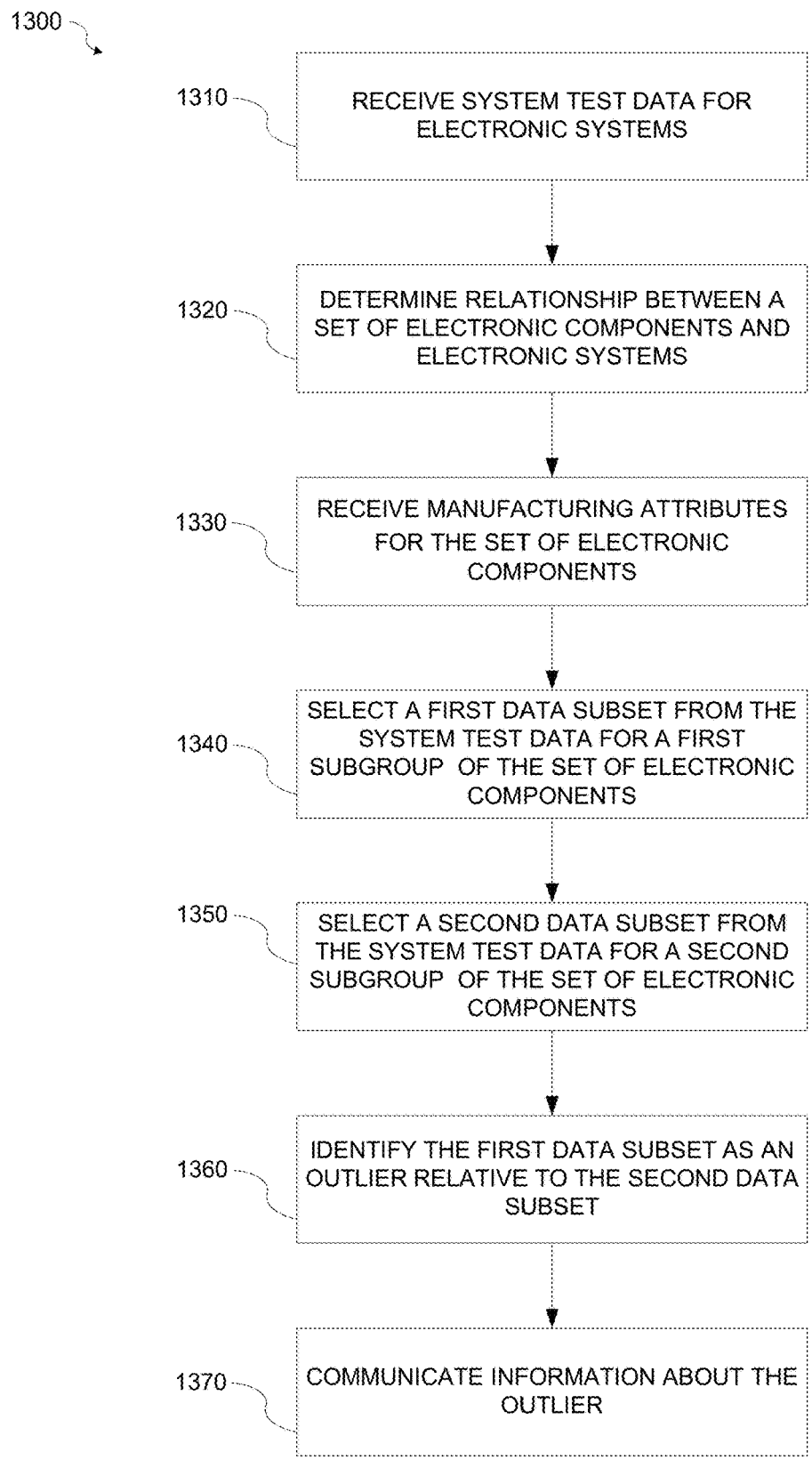
FIG. 13 is a flowchart of a another method for identifying an outlier in a data subset according to various aspects of the present disclosure.

FIG. 13 is a flowchart of a another method 1300 for identifying an outlier in a data subset according to various aspects of the present disclosure. Referring to FIG. 13, at block 1310, system test data for a plurality of electronic systems may be received. For example, the system test data may be received from a system manufacturer, an equipment manufacturer, a contract test company, other third parties, etc. The system test data may include system failure data, system performance data, numeric data, and/or categorical data. The system test data may or may not include component test data. The system test data may pass system specifications such that an electronic system is operable within the specifications for the particular electronic system. The electronic system may be, for example, but not limited to, an IC, a chip, a memory, a battery, a display, a transmitter, a receiver, a MCP, a MCM, a 2D IC/SiP, a circuit board, a system, a module, etc. The electronic systems may include a plurality of electronic component.

At block 1320, a relationship between a set of the electronic components and the electronic systems may be determined. The set of the electronic components may be assembled on the electronic systems. The set of the electronic components may be a type of electronic component, for example, but not limited to, a power supply.

At block 1330, manufacturing attributes for the set of electronic components may be received. The manufacturing attributes may include spatial data for the set of the electronic components. A spatial pattern may be determined through clustering of spatial data. Alternatively, the spatial pattern may be determined through clustering of manufacturing attributes. Alternatively or additionally, the manufacturing attributes may include, for example, but not limited to, a lot or batch number, a substrate identifier, substrate x-y coordinates for each of the set of electronic components, etc.

At block 1340, a first data subset from the system test data corresponding to a first subgroup of the set of electronic components may be selected. The correspondence may be based on an established relationship. The first subgroup may include components within a first area defined on a substrate according to a spatial pattern. The first area may be associated with a central portion of the substrate. Alternatively, the first area may be associated with a periphery of the substrate. The first subgroup may be fewer than all of the set of electronic components on the substrate. The substrate may be, for example, but not limited to a silicon wafer, a glass substrate, or other substrate.

At block 1350, a second data subset from the system test data corresponding to a second subgroup of the set of electronic components may be selected. The second subgroup may include components within a second area defined on a substrate according to a spatial pattern.

The second area may be associated with a periphery of the substrate. The second subgroup may be fewer than all of the set of electronic components on the substrate. The second area may exclude the first area. The first data subset and the second data subset may include a same set of system tests. The same set of system tests may include a single system test or a plurality of system tests. Alternatively, the first data subset and the second data subset may include different system tests.

The first data subset may include a first system test and the second data subset may include a second system test, or the first data subset may include a first system test and a third system test and the second data subset may include the first system test and a fourth system test.

The components within the first and second areas may be adjacent components. The first and second data subsets may be associated with systems having system test data passing system specifications. The first and second data subset may corresponds to characteristics of a type of electronic component, for example, but not limited to, power output of an electronic system for a power supply component. The system test data corresponding to the first and second subgroups of the set of electronic components may include system test data for a system including a component, or specific test data from the system test data that may be attributed to or affected by one or more specific component, including, for example, but not limited to, system frequency or CPU frequency.

At block 1360, the first data subset may be identified as an outlier relative to the second data subset. The outlier may be a local outlier or a global outlier. Identifying the outlier may include receiving data for failing systems but only analyzing system test data for non-failing systems. The outlier may be identified automatically and/or dynamically. Automatically identifying the outlier may include aggregating categorical data. Identifying the outlier may include determining whether the data subset includes a sufficient amount of data to perform a desired analysis. In accordance with various aspects of the present disclosure, the outlier may be identified at least in part by aggregating data subsets across multiple substrates.

At block 1370, the information about the outlier may be communicated. For example, the information about the outlier may be communicated to a system manufacturer of a component manufacturer. The information about the outlier may identify a board and/or a component to which the outlier corresponds.

Figure 14:
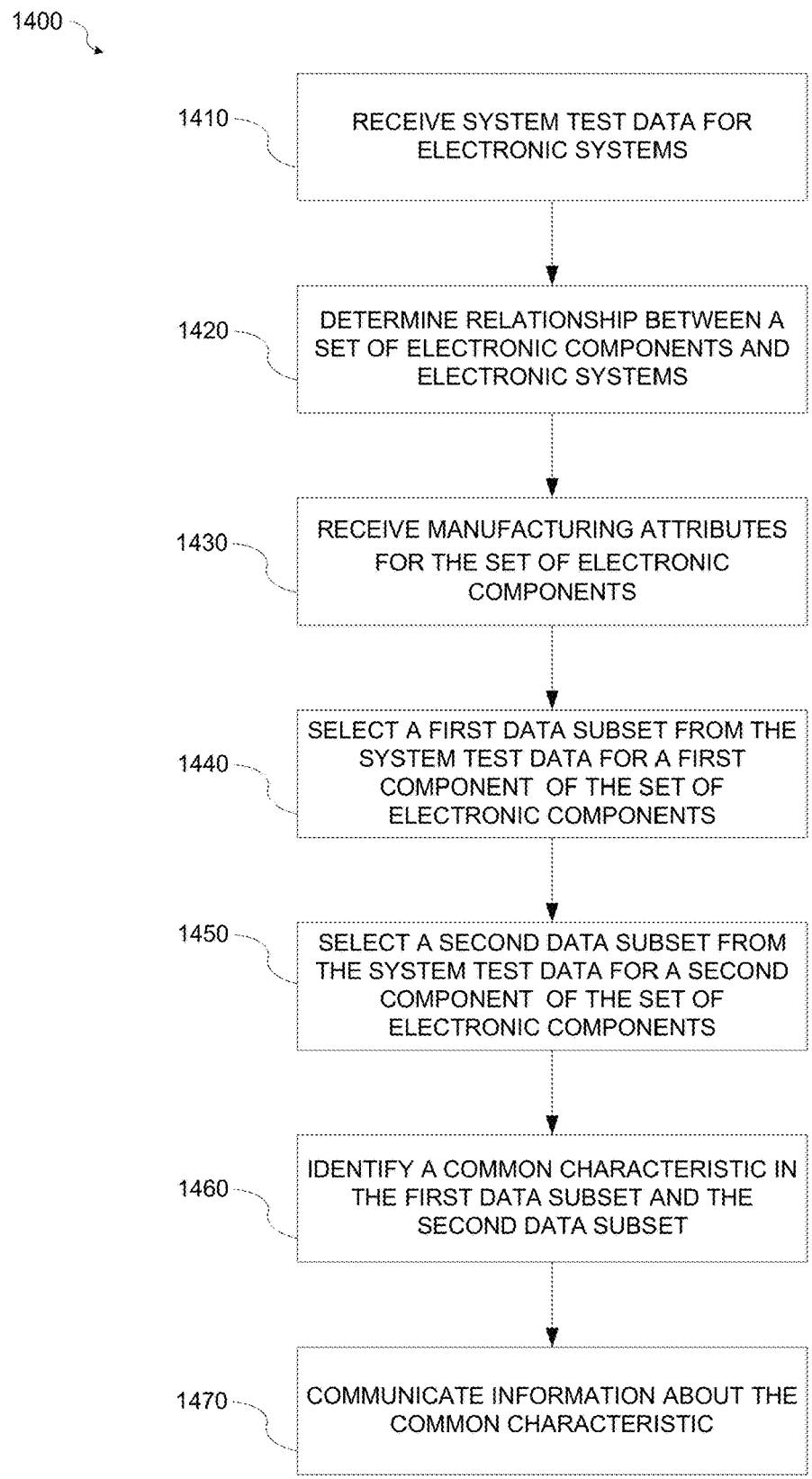
FIG. 14 is a flowchart of a method for identifying a common characteristic in a plurality of data subset according to various aspects of the present disclosure.

FIG. 14 is a flowchart of a method 1400 for identifying a common characteristic in a plurality of data subset according to various aspects of the present disclosure. Referring to FIG. 14, at block 1410, system test data for a plurality of electronic systems may be received. For example, the system test data may be received from a system manufacturer, an equipment manufacturer, a contract test company, other third parties, etc. The system test data may or may not include component test data. The system test data may include system failure data, system performance data, numeric data, and/or categorical data. The system test data may pass system specifications such that an electronic system is operable within the specifications for the particular electronic system. The electronic system may be, for example, but not limited to, an IC, a chip, a memory, a battery, a display, a transmitter, a receiver, a MCP, a MCM, a 2D IC/SiP, a circuit board, a system, a module, etc. The electronic system may include a plurality of electronic components.

At block 1420, a relationship between a set of the electronic components and the electronic systems may be determined. The set of the electronic components may be assembled on the electronic systems. The set of the electronic components may be a type of electronic component, for example, but not limited to, a power supply.

At block 1430, manufacturing attributes for the set of electronic components may be received. The manufacturing attributes may include spatial data for the set of the electronic components. A spatial pattern may be determined through clustering of spatial data. Alternatively, the spatial pattern may be determined through clustering of manufacturing attributes. Alternatively or additionally, the manufacturing attributes may include, for example, but not limited to, a lot or batch number, a substrate identifier, substrate x-y coordinates for each of the set of electronic components, etc.

At block 1440, a first data subset from the system test data corresponding to a first component of the set of electronic components may be selected. The correspondence may be based on an established relationship. The first component may be associated with a location on a first substrate. At block 1450, a second data subset from the system test data corresponding to a second component of the set of electronic components may be selected. The correspondence may be based on an established relationship. The first substrate may be, for example, but not limited to a silicon wafer, a glass substrate, or other substrate. The second component may be associated with a same location on a second substrate as the location that the first component is associated with on the first substrate. Thus, the first component and the second component may occupy the same location on two different substrates. The second substrate may be, for example, but not limited to a silicon wafer, a glass substrate, or other substrate.

At block 1460, a common characteristic in the first data subset and the second data subset may be identified. The common characteristic may be identified automatically and/or dynamically. Automatically identifying the common characteristic may include aggregating categorical data. Identifying the common characteristic may include determining whether the data subset includes a sufficient amount of data to perform a desired analysis. The common characteristic may indicate performance higher than a baseline. Alternatively, the common characteristic may indicate performance lower than a standard. The baseline may be based on a third data subset corresponding to one or more components from the set of electronic components. The one or more components may be associated with locations other than the location on the first and second substrates with which the first and second components may be associated. In accordance with various aspects of the present disclosure, the common characteristic may be identified at least in part by aggregating data subsets across multiple substrates.

At block 1470, the information about the common characteristic may be communicated. For example, the information about the outlier may be communicated to a system manufacturer of a component manufacturer.

Figure 15:
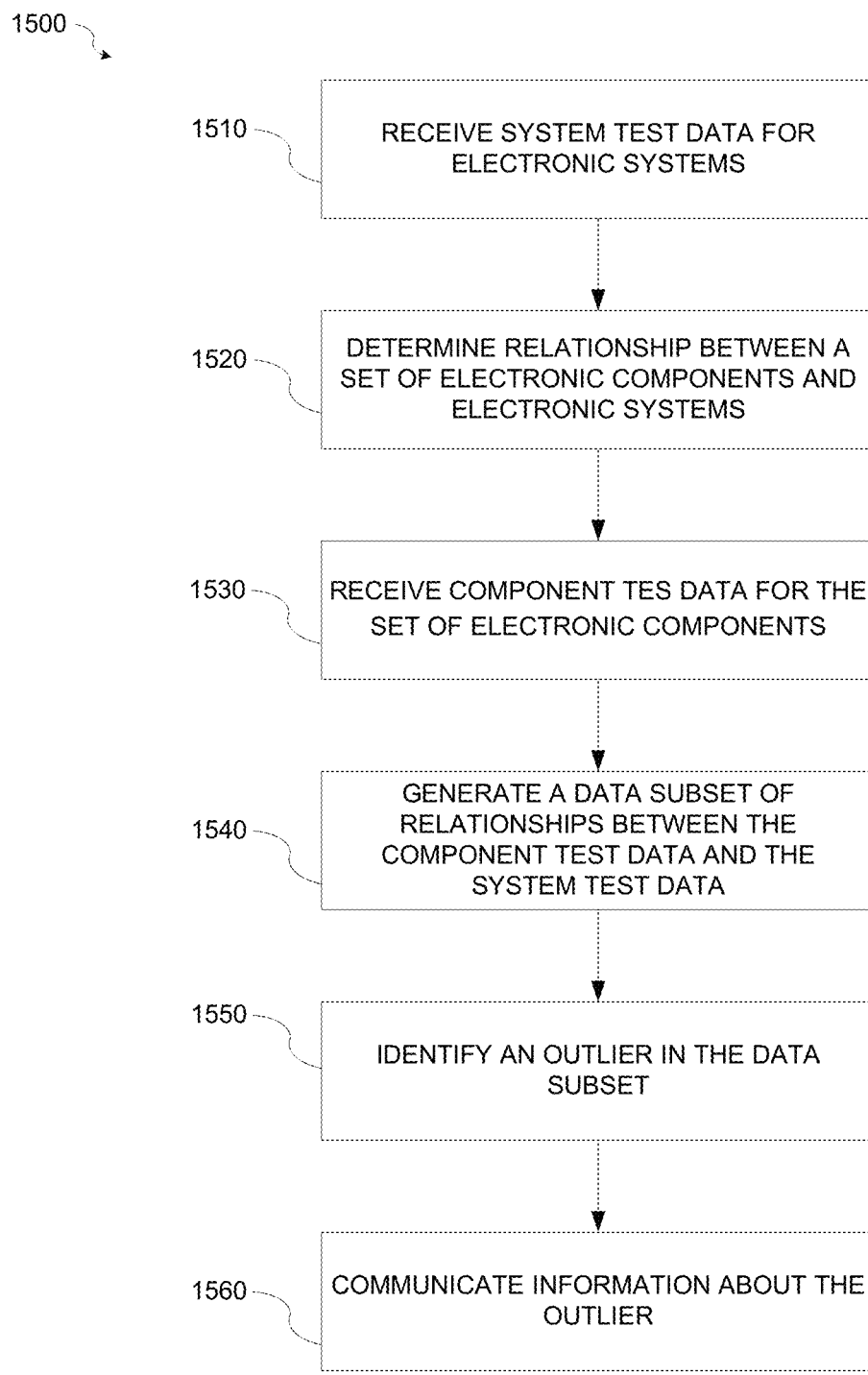
FIG. 15 is a flowchart of another method for identifying an outlier in a data subset according to various aspects of the present disclosure.

FIG. 15 is a flowchart of another method 1500 for identifying an outlier in a data subset according to various aspects of the present disclosure. Referring to FIG. 15, at block 1510, system test data for a plurality of electronic systems may be received. For example, the system test data may be received from a system manufacturer, an equipment manufacturer, a contract test company, other third parties, etc. The system test data may or may not include component test data. The system test data may include system failure data, system performance data, numeric data, and/or categorical data. The system test data may pass system specifications such that an electronic system is operable within the specifications for the particular electronic system. The electronic system may be, for example, but not limited to, an IC, a chip, a memory, a battery, a display, a transmitter, a receiver, a MCP, a MCM, a 2D IC/SiP, a circuit board, a system, a module, etc. The electronic systems may include a plurality of electronic components.

At block 1520, a relationship between a set of the electronic components and the electronic systems may be determined. The set of the electronic components may be assembled on the electronic systems. The set of the electronic components may be a type of electronic component, for example, but not limited to, a power supply.

At block 1530, component test data for the set of electronic components may be received. The component test data may be, for example, but not limited to, IC test data, multi-chip module test data, etc., and may include numeric data and/or categorical data. The component test data may be received from a component manufacturer, a contract test company working in conjunction with the component manufacturer, a system manufacturer who may test components in advance of system assembly, etc. At block 1540, a data subset of relationships between the component test data and the system test data of the set of electronic systems may be generated. Data subset generation may include aggregating categorical data.

At block 1550, an outlier in the data subset may be identified. The outlier may be an outlier relative to the data subset. Alternatively or additionally, the outlier may be a local outlier or a global outlier. The outlier in the data subset may be identified automatically and/or dynamically. Automatically identifying the outlier may include aggregating categorical data. Identifying the outlier may include determining whether the data subset includes a sufficient amount of data to perform a desired analysis. In accordance with various aspects of the present disclosure, the outlier may be identified at least in part by aggregating data subsets across multiple substrates. At block 1560, the information about the outlier may be communicated. For example, the information about the outlier may be communicated to a system manufacturer of a component manufacturer. The information about the outlier may identify a board and/or a component to which the outlier corresponds.

Figure 16:
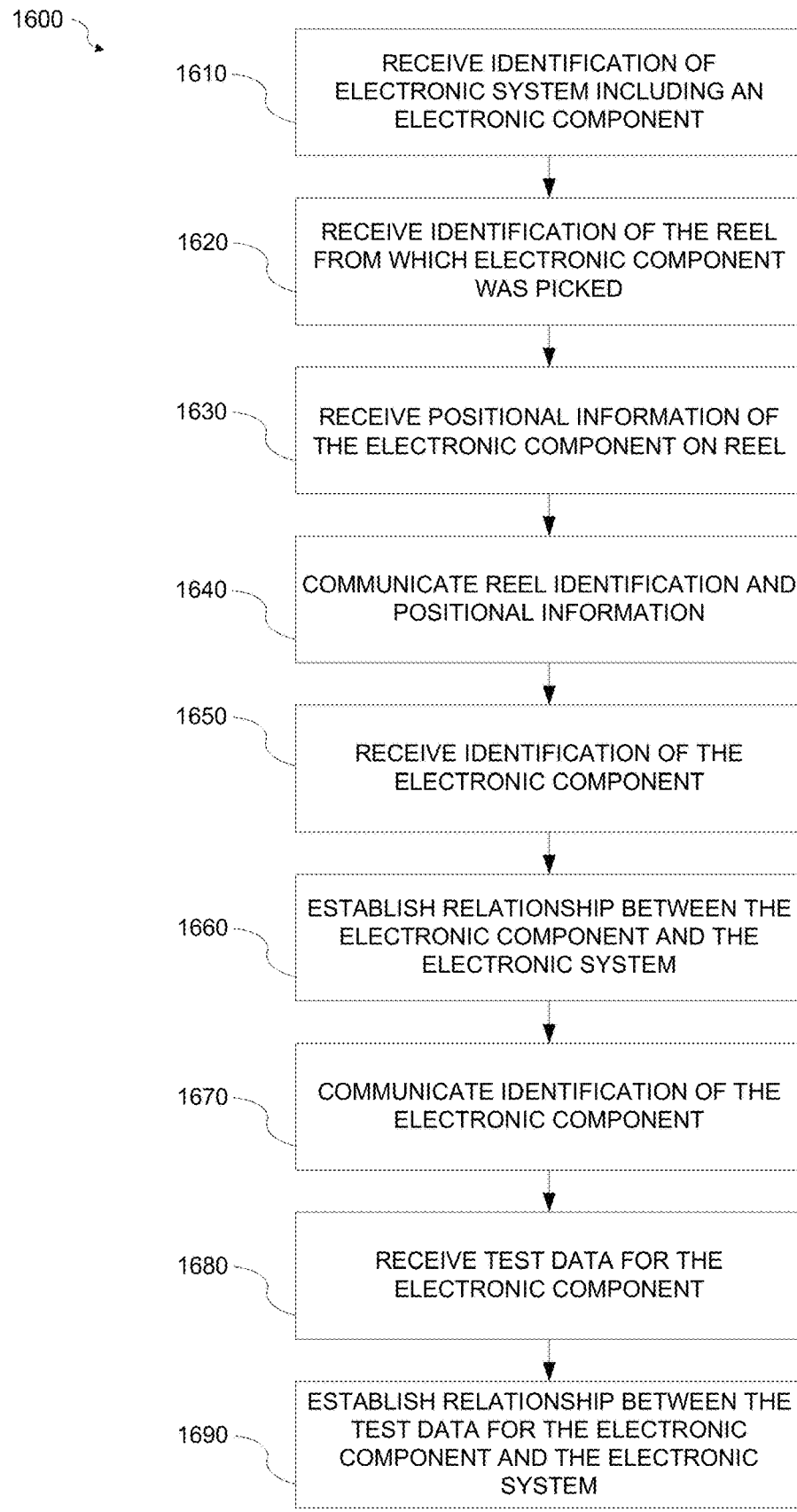
FIG. 16 is a flowchart of a method for establishing the relationship between an electronic component and an electronic system according to various aspects of the present disclosure.

FIG. 16 is a flowchart of a method 1600 for establishing the relationship between an electronic component and an electronic system according to various aspects of the present disclosure. Referring to FIG. 16, at block 1610, an identification of the electronic system upon which the electronic component is assembled may be received. For example, the identification of the electronic system may be received from an electronic system manufacturer or another source. The electronic component may include a semiconductor device.

At block 1620, an identification of a reel from which the electronic component was picked up and placed on the electronic system may be received. The reel may include the electronic component and a plurality of other electronic components arranged in a sequential order. At block 1630, positional information regarding a position of the electronic component within the sequential order in the reel may be received.

At block 1640, the reel identification and the positional information of the electronic component may be communicated. For example, the reel identification and the positional information may be communicated to the manufacturer of the reel. At block 1650, an identification of the electronic component may be received. For example, in response to receiving the reel identification and the positional information of the electronic component, the manufacturer of the reel may provide the identification of the electronic component.

At block 1660, a relationship between the electronic component and the electronic system may be established.

At block 1670, the identification of the electronic component may be communicated. For example, the identification of the electronic component may be communicated to the manufacturer of the electronic component. At block 1680, test data for the electronic component may be received. For example, the test data may be received from the manufacturer of the electronic component or another source. The test data may include operating characteristics of the electronic component.

At block 1690, a relationship between the test data for the electronic component and the electronic system may be established.

Figure 17:
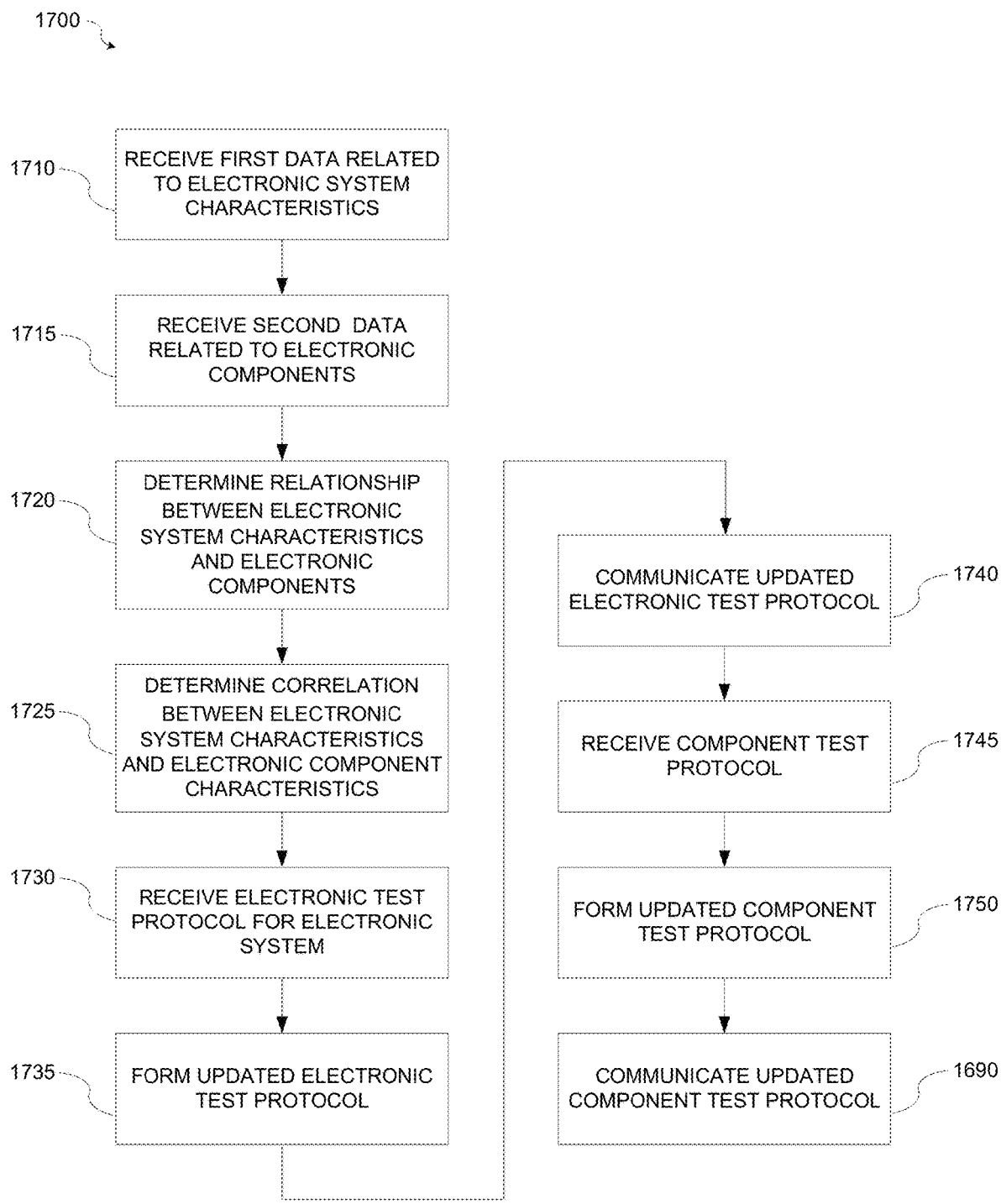
FIG. 17 is a flowchart of a method for determining a correlation between characteristics of an electronic system and characteristics of a plurality of electronic components according to various aspects of the present disclosure.

FIG. 17 is a flowchart of a method 1700 for determining a correlation between characteristics of an electronic system and characteristics of a plurality of electronic components according to various aspects of the present disclosure. Referring to FIG. 17, at block 1710, first data related to the characteristics of the electronic system may be received. At block 1715, second data related to the plurality of electronic components may be received. The plurality of electronic components may include semiconductor components. At block 1720, a relationship between the characteristics of the electronic system and the plurality of electronic components may be determined. For example, the first data and the second data may be analyzed to determine the relationship between the characteristics. Proprietary data from the characteristics of the plurality of electronic components may be removed.

At block 1725, a correlation between the characteristics of the electronic system and the characteristics of the plurality of electronic components may be determined. The correlation may be based on the analysis of the first data and the second data. At block 1730, an electronic test protocol related to the electronic system may be received. At block 1735, an updated electronic test protocol may be formed. The updated electronic test protocol may be based on the characteristics of the electronic components. At block 1740, the updated electronic test protocol may be communicated. For example, the updated electronic test protocol may be communicated to a manufacturer of the electronic system.

At block 1745, a semiconductor component test protocol related to the electronic components may be received. At block 1750, an updated semiconductor component test protocol may be formed. The updated semiconductor component test protocol may be based on the characteristics of the electronic system. The updated electronic component test protocol may be narrowed or broadened.

At block 1755, the updated semiconductor component test protocol may be communicated. For example, the updated semiconductor component test protocol may be communicated to a manufacturer of the electronic components.

Figure 18:
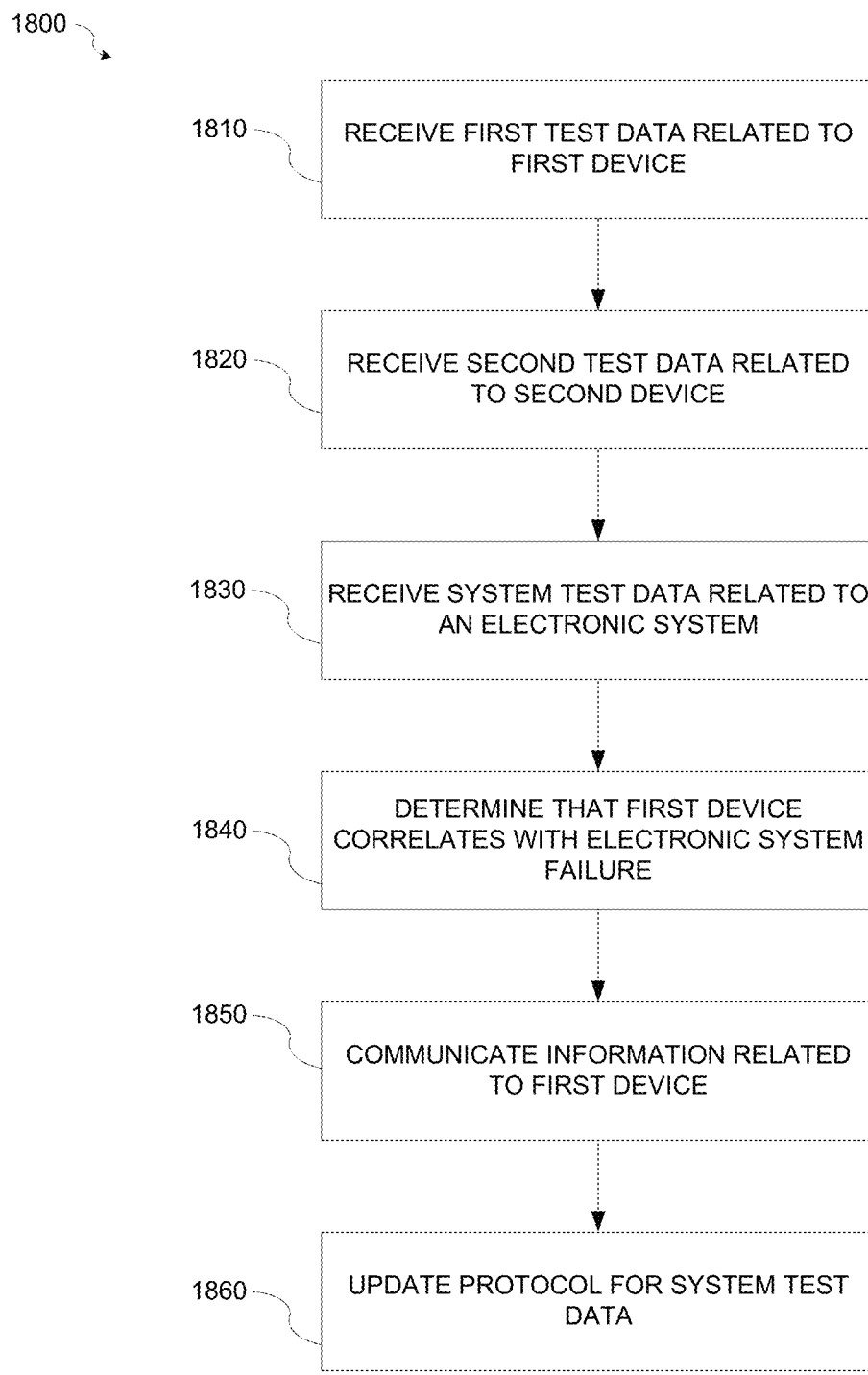
FIG. 18 is a flowchart of a method for providing data characterizing electronic system performance according to various aspects of the present disclosure.

FIG. 18 is a flowchart of a method 1800 for providing data characterizing electronic system performance according to various aspects of the present disclosure. Referring to FIG. 18, at block 1810, first test data related to a first semiconductor device may be received. The first test data may be received from a first semiconductor device manufacturer or another source. The first test data may be in a first range. At block 1820, second test data related to a second semiconductor device may be received. The second test data may be received from a second semiconductor device manufacturer or another source. At block 1830, system test data related to an electronic system may be received. Electronic system may include a first semiconductor device and the second semiconductor device. The system test data may indicate failures of the electronic system.

At block 1840, it may be determined that the first semiconductor device associated with a portion of the first range correlates with the failure of the electronic system. The determination may be made based on the first test data, the second test data, and the system test data. At block 1850, information associated with the first semiconductor device associated with a portion of the first range may be communicated. Proprietary data may be removed prior to communicating the information.

At block 1860, a protocol for the system test data may be updated. The protocol may be updated based on a determination that the first semiconductor device associated with a portion of the first range correlates with the failure of the electronic system. Updating the protocol may include adding or removing one or more elements from the system test.

Figure 19:
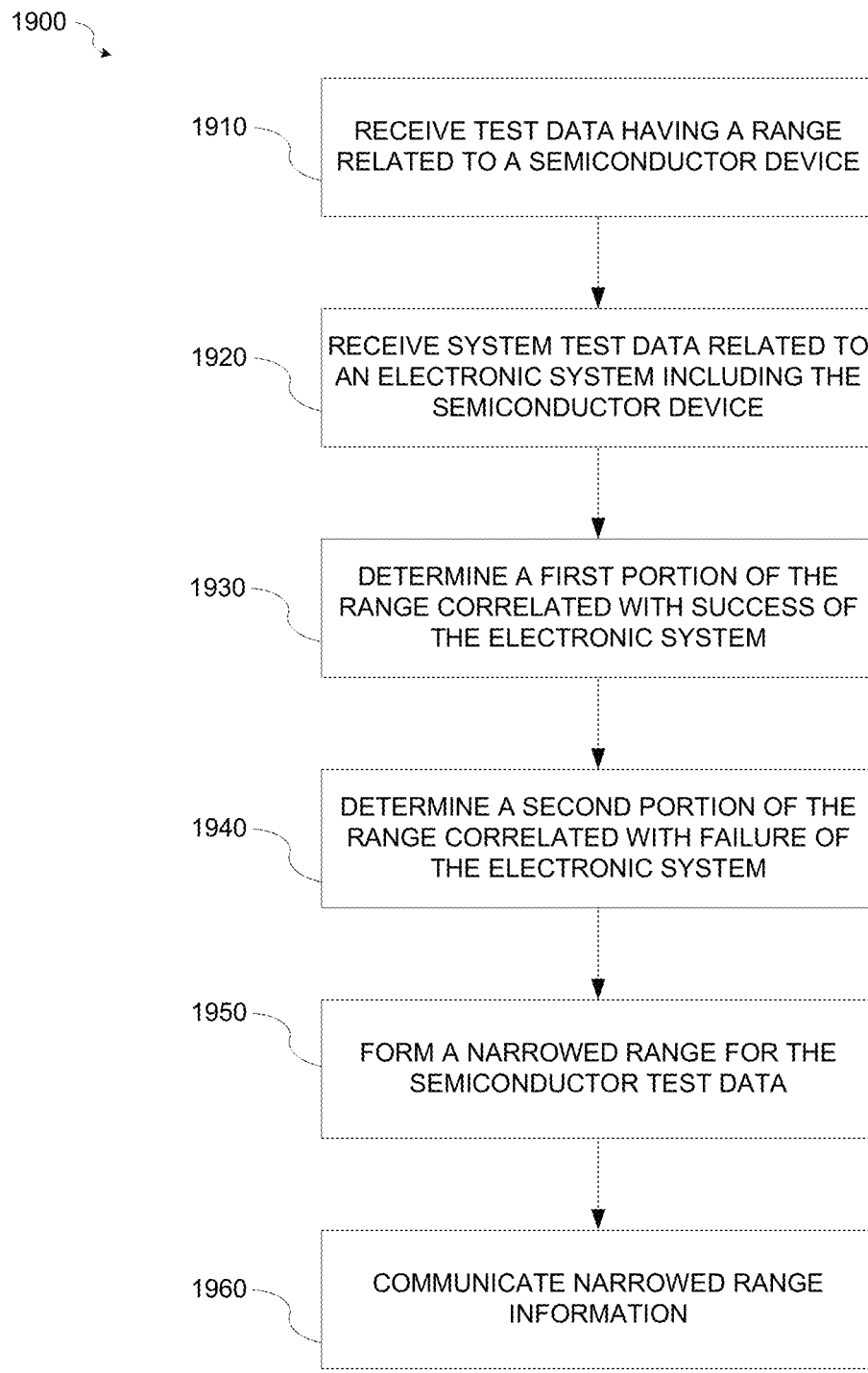
FIG. 19 is a flowchart of a method for providing data characterizing semiconductor device performance according to various aspects of the present disclosure.

FIG. 19 is a flowchart of a method 1900 for providing data characterizing semiconductor device performance according to various aspects of the present disclosure. Referring to FIG. 19, at block 1910, semiconductor test data related to a semiconductor device may be received. The semiconductor test data may be in a range. At block 1920, system test data related to an electronic system may be received. The electronic system may include the first semiconductor device. The system test data may indicate a failure of the electronic system.

At block 1930, a first portion of the range correlating with the success of the electronic system may be determined. The determination may be made based on the system test data. At block 1940, a second portion of the range correlating with the failure of the electronic system may be determined. The determination may be made based on the system test data. At block 1950, a narrow range excluding the second portion of the range may be formed for the semiconductor test data.

At block 1960, the narrowed range information may be communicated. For example, the narrowed range information may be communicated to, for example, but not limited to, the semiconductor manufacturer, the electronics manufacturer, etc.

Figure 20:
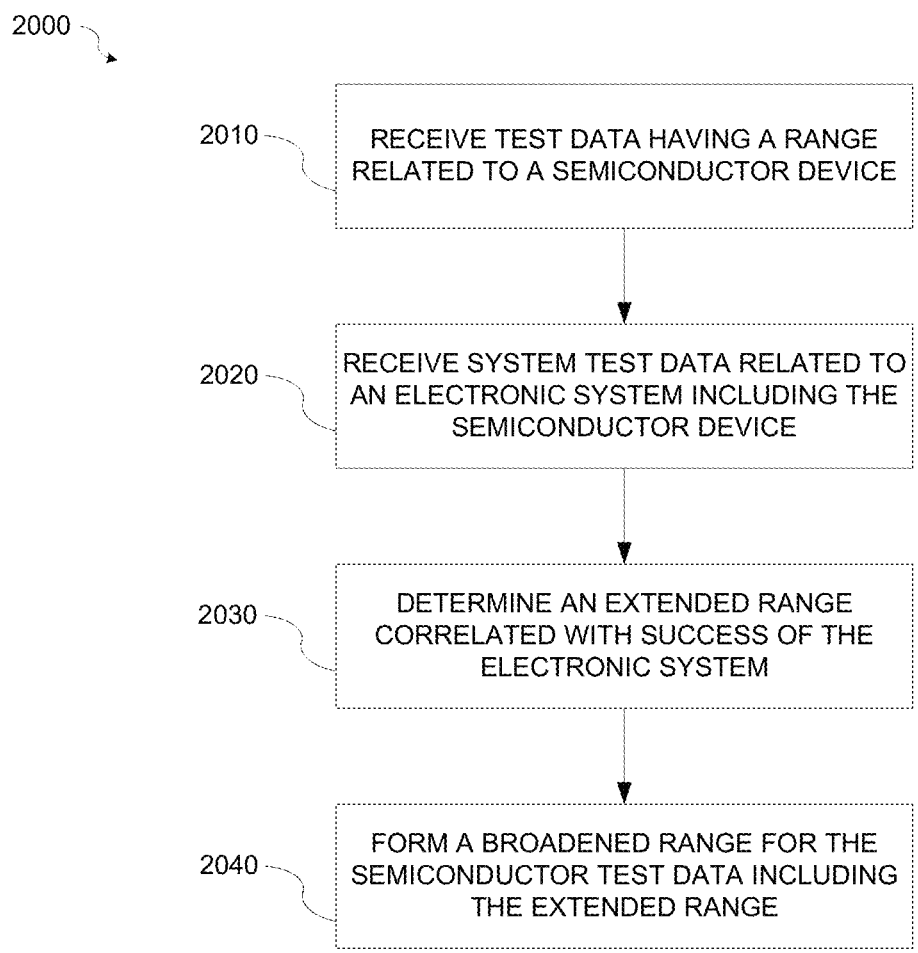
FIG. 20 is a flowchart of a method for providing data characterizing semiconductor device performance according to various aspects of the present disclosure.

FIG. 20 is a flowchart of a method 2000 for providing data characterizing semiconductor device performance according to various aspects of the present disclosure. Referring to FIG. 20, at block 2010, semiconductor test data related to a semiconductor device may be received. The semiconductor test data may be in a range. At block 2020, system test data related to an electronic system may be received. The electronic system may include the first semiconductor device. The system test data may indicate a success of the electronic system.

At block 2030, an extended range correlating with the success of the electronic system may be determined. The determination may be made based on the system test data. At block 2040, a broadened range including the extended range may be formed for the semiconductor test data.

As discussed above, in a distributed value chain, the component manufacturers may be a contract manufacturer (CM), an original equipment manufacturer (OEM), an original component manufacturer (OCM), a brand owner, a test or an assembly house, or any other member of the value chain from whom the component manufacturing attributes (and test data) can be obtained.

Moreover, the system manufacturers may be a contract manufacturer (CM), an original equipment manufacturer (OEM), an original component manufacturer (OCM), a brand owner, a test or an assembly house, or any other member of the value chain from whom the system test data can be obtained Electronic components ship on reels (i.e., tape) including a plurality of components. During system assembly, pick and place systems pick a component from the reel and place it on a printed circuit board. Using embodiments of the present invention, the location of the component on the reel is tracked during assembly in order to create a map between the board and the components on the board. Thus, a genealogy can be created during the pick and place operation.

In contrast with conventional systems that pick and place components in a first-in first-out method, embodiments of the present invention receive information from the OCM related to the components on the reel. As an example, a unique component ID could be recorded in association with a location on the reel. This information can be created when the reel is constructed at the OCM. During board assembly, the reel identifier is used to create a mapping between the board and the components: board A receives a component located at a predetermined position (e.g., position B) on the reel; board A+1 receives a component located at a second predetermined position (e.g., position B+1) on the reel; etc. Given the OCM data defining the characteristics of each component on the reel, the mapping between the board and the components enables the system test to be aware of the specific component performance data.

Thus, genealogy data can be created for the boards given the component position information associated with the reel. Because OEMs do not typically have access to component performance data, tracking of particular components is not performed. However, using embodiments of the present invention, the availability of the component test data at the analytics system can be used with the genealogy data linking the particular components and the system (e.g., printed circuit board).

According to an various aspects of the present disclosure, a method of creating a genealogy for a system is provided. The method may include receiving component test data for a plurality of components disposed on a reel. In an embodiment, the component test data is correlated with the position of each of the components on the reel, for example, by a component identifier. The method may also include recording a board identifier and a component identifier (e.g., location on a reel of a particular component). In some embodiments, as the system is assembled, data on the reels used in the assembly and the position on the reel of the components used in assembly can be recorded. This data can thus be used to reference a particular component, for which component test data is available, to the system in which the particular component is included.

The method may also include receiving system test data for a system including one of the plurality of components. Additionally, data related to the system design, including layout of various components on the board, can be received. Using the component test data for the particular component included in the system, one or more correlations between the system test data and the component test data for the particular component included in the system can be determined. In some embodiments, the correlations are made between the system test data and a number of components (e.g., different components) that are included in the system. One of ordinary skill in the art would recognize many variations, modifications, and alternatives.

In an implementation, the system composition can be reconstructed after system assembly using the method described herein. Accordingly, correlations between system performance and component performance are enabled by embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method comprising:
    receiving, from a system manufacturer, system test data for a plurality of electronic systems, each of the plurality of electronic systems comprising a plurality of electronic components;
    determining a relationship between a set of electronic components from the plurality of electronic components and the electronic systems upon which the electronic components of the set of electronic components are assembled;
    receiving, from a component manufacturer, manufacturing attributes including spatial data for the set of electronic components;
    selecting a data subset from the system test data corresponding to a subgroup of the set of electronic components, wherein the subgroup comprises electronic components within an area defined on a substrate according to a spatial pattern and that is fewer than all of the set of electronic components on the substrate;
    identifying an outlier relative to the data subset; and
    communicating information about the outlier to at least one of the system manufacturer or the component manufacturer.

2. The method of claim 1 wherein the electronic components within an area comprise adjacent components.

3. The method of claim 1 wherein the spatial pattern is determined through clustering of the spatial data for the set of electronic components.

4. The method of claim 1 wherein the spatial pattern is determined through clustering of manufacturing attributes.

5. The method of claim 1 wherein the system test data passes system specifications such that an electronic system of the plurality of electronic systems is operable within predefined specifications for the electronic system of the plurality of electronic systems.

6. The method of claim 1 wherein the manufacturing attributes comprise at least one of lot or batch number, substrate identifier, or substrate x-y coordinates for each of the set of electronic components.

7. The method of claim 1 wherein the spatial data for the set of electronic components comprises substrate location information for each of the set of electronic components.

8. The method of claim 1 wherein the set of electronic components comprises a type of electronic component.

9. The method of claim 8 wherein the data subset corresponds to characteristics of the type of electronic component.

10. The method of claim 1 wherein the system test data corresponding to the subgroup of the set of electronic components comprises system test data for a system including an electronic component.

11. The method of claim 1 wherein the system test data corresponding to the subgroup of the set of electronic components comprises specific test data from the system test data that may be attributed to or affected by one or more specific component.

12. A method comprising:
    receiving, from a system manufacturer, system test data for a plurality of electronic systems, each of the plurality of electronic systems comprising a plurality of electronic components;
    determining a relationship between a set of electronic components from the plurality of electronic components and the electronic systems upon which the electronic components of the set of electronic components are assembled;
    receiving, from a component manufacturer, manufacturing attributes including spatial data for the set of electronic components;
    selecting a first data subset from the system test data corresponding to a first subgroup of the set of electronic components, wherein the first subgroup comprises electronic components within a first area defined on a substrate according to a spatial pattern and that is fewer than all of the set of electronic components on the substrate;
    selecting a second data subset from the system test data corresponding to a second subgroup of the set of electronic components, wherein the second subgroup comprises electronic components within a second area defined on the substrate that differs from the first area;
    identifying the first data subset as an outlier relative to the second data subset; and
    communicating information about the outlier to at least one of the system manufacturer or the component manufacturer.

13. The method of claim 12 wherein the second area excludes the first area.

14. The method of claim 12 wherein the first data subset and the second data subset include a same set of system tests.

15. The method of claim 12 wherein the first data subset and the second data subset include different system tests.

16. The method of claim 15 wherein the first data subset comprises a first system test and the second data subset comprises a second system test or the first data subset comprises a first system test and a third system test and the second data subset comprises the first system test and a fourth system test.

* * * * *